United States Patent
Saito et al.

(10) Patent No.: US 12,402,326 B2
(45) Date of Patent: Aug. 26, 2025

(54) MAGNETIC FILM, MAGNETORESISTANCE EFFECT ELEMENT AND MAGNETIC MEMORY

(71) Applicant: TOHOKU UNIVERSITY, Sendai (JP)

(72) Inventors: Yoshiaki Saito, Miyagi (JP); Shoji Ikeda, Miyagi (JP); Tetsuo Endoh, Miyagi (JP)

(73) Assignee: TOHOKU UNIVERSITY, Miyagi (JP)

( * ) Notice: Subject to any disclaimer, the term of this patent is extended or adjusted under 35 U.S.C. 154(b) by 788 days.

(21) Appl. No.: 17/400,078

(22) Filed: Aug. 11, 2021

(65) Prior Publication Data

US 2022/0052111 A1 Feb. 17, 2022

(30) Foreign Application Priority Data

Aug. 12, 2020 (JP) ................................. 2020-136146

(51) Int. Cl.
*H10B 61/00* (2023.01)
*H10N 50/10* (2023.01)
(Continued)

(52) U.S. Cl.
CPC ............. *H10B 61/20* (2023.02); *H10N 50/10* (2023.02); *H10N 50/80* (2023.02); *H10N 50/85* (2023.02)

(58) Field of Classification Search
CPC ........ H10B 61/20; H10N 50/10; H10N 50/80; H10N 50/85; G11C 11/161; H01F 10/002;
(Continued)

(56) References Cited

U.S. PATENT DOCUMENTS 10,170,694 B1 * 1/2019 Shirotori ................. G11C 11/18
11,488,647 B2 * 11/2022 Sun ......................... G11C 11/161
(Continued)

FOREIGN PATENT DOCUMENTS

WO  2018042732 A1  3/2018
WO  2018043377 A1  3/2018

OTHER PUBLICATIONS

Young Min Lee, et. al., "Highly Scalable STT-MRAM with MTJs of Top-pinned Structure in 1T/1MTJ Cell", 2010 Symposium on VLSI Technology Digest of Technical Papers, 49-50, (2010) Journal of Applied Physics 115, 172615 (2014) (L Thomas et al., Apr. 15, 2014).

(Continued)

*Primary Examiner* — Fernando L Toledo
*Assistant Examiner* — Marshall Mu-Nuo Hatfield
(74) *Attorney, Agent, or Firm* — Procopio, Cory, Hargreaves & Savitch LLP

(57) ABSTRACT

Provided are a magnetic film, a magnetoresistance effect element and a magnetic memory which take advantages of atop-pinned structure and a bottom-pinned structure, maintain perpendicular magnetic anisotropy of magnetic layers in a fixing layer and allow strong pinning even in an annealing treatment after a protective film is formed.
A fixing layer of a magnetic film has a basic configuration in which a first magnetic layer (21), a first non-magnetic layer (31), a first Pt layer (41), a second magnetic layer (22) disposed adjacent to each other in this order.
The magnetization directions of the first magnetic layer (21) and the second magnetic layer (22) are both a direction perpendicular to the film surface, and an antiferromagnetic coupling is formed between the first magnetic layer (21) and the second magnetic layer (22).

13 Claims, 32 Drawing Sheets

(51) Int. Cl.
*H10N 50/80* (2023.01)
*H10N 50/85* (2023.01)

(58) Field of Classification Search
CPC .... H01F 10/0009; H01F 10/265; H01F 10/30; H01F 10/32–3295
See application file for complete search history.

(56) References Cited

U.S. PATENT DOCUMENTS

| | | | |
|---|---|---|---|
| 2008/0070063 A1* | 3/2008 | Ibusuki | G11B 5/676 428/828.1 |
| 2014/0361391 A1* | 12/2014 | Shen | H10N 50/01 257/421 |
| 2016/0163966 A1 | 6/2016 | Guohan et al. | |
| 2019/0157549 A1* | 5/2019 | Sun | H01F 41/303 |
| 2019/0189917 A1 | 6/2019 | Hiroaki et al. | |
| 2019/0198755 A1 | 6/2019 | Ito et al. | |
| 2020/0006425 A1* | 1/2020 | Lin | H10N 50/01 |

OTHER PUBLICATIONS

Tiroki Koike, et. al., "Wide operational margin capability of 1 kbit spin-transfer-torque memory array chip with 1-PMOS and 1-bottom-pin-magnetic-tunnel-junction type cell", Jpn. J. Appl. Phys. 53, 04ED13 (2014).
Office Action for corresponding Japanese patent application No. 2021-131166 dated Jan. 28, 2025, 10 pages.

* cited by examiner

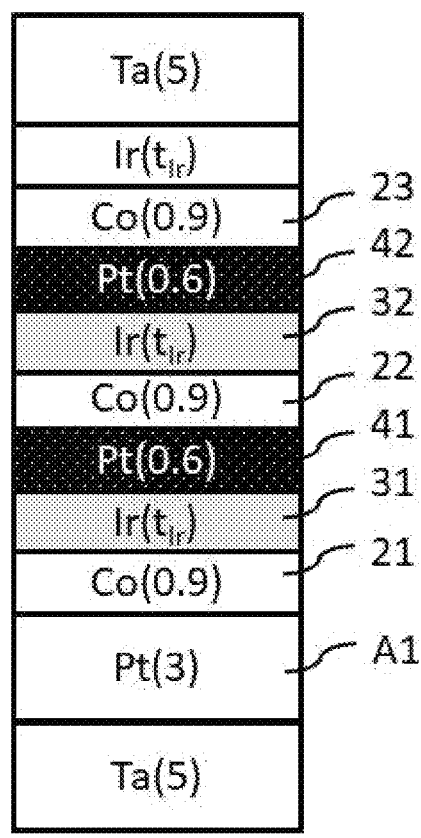

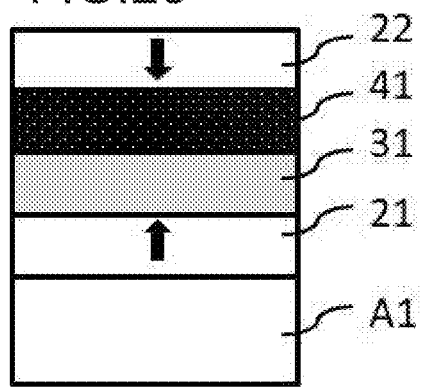
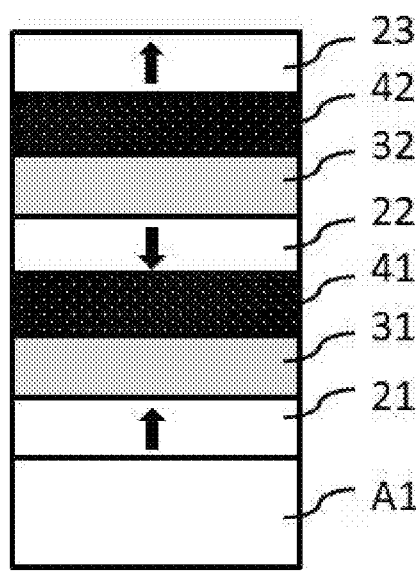

Prior Art

Prior Art

MAGNETIC FILM, MAGNETORESISTANCE EFFECT ELEMENT AND MAGNETIC MEMORY

BACKGROUND OF THE INVENTION

1. Field of the Invention

The present invention relates to a magnetic film, a magnetoresistance effect element including the magnetic film, and a magnetic memory including the magnetoresistance effect element.

2. Description of the Related Art

A magnetic random-access memory (MRAM; magnetic memory) is a non-volatile memory using a magnetic tunnel junction (MTJ).

An MRAM, which does not consume power during standby, has high-speed operability and high write endurance, and of which a memory size can be reduced, is attracting attention as an integrated embedded memory for a next-generation logic integrated circuit.

A magnetoresistance effect element used in an MRAM has a basic structure in which a barrier layer is interposed between a recording layer and a reference layer (fixing layer). Bit information recorded in the magnetic layer (recording layer) of the MRAM passes through the barrier layer and is read by using a tunnel magnetoresistance (TMR) effect.

For writing in a magnetic layer (recording layer), there are a method using a magnetic field and a method using a current, and examples of MRAMs using the latter writing method include a 2-terminal type in which bit information is written in a magnetic layer (recording layer) using spin-transfer-torque (STT)-induced magnetization reversal or the like and a 3-terminal type in which bit information is written in a magnetic layer (recording layer) using spin-orbit-torque (SOT)-induced magnetization reversal or the like.

In the STT-MRAM and SOT-MRAM, a magnetoresistance effect element having an MTJ is disposed by connecting its electrode and a select transistor. In the STT-MRAM, a drain of one select transistor, a lower electrode of one magnetoresistance effect element, an upper electrode of the magnetoresistance effect element, and a bit line are connected to each other, and a magnetization reversal operation of the magnetic layer (recording layer) of the MTJ element is performed by supplying a current to a magnetoresistance effect element from each select transistor. In the SOT-MRAM, one bit is composed of two select transistors and one magnetoresistance effect element, and a magnetization reversal operation of the magnetic layer (recording layer) of the MTJ element is performed by supplying a current to a heavy metal layer which is the lower wiring of the magnetoresistance effect element from the select transistor. Examples of select transistors include a metal-oxide-semiconductor field-effect transistor (MOSFET).

In addition, magnetoresistance effect elements are classified into those of a top-pinned structure in which a recording layer, a barrier layer, and a fixing layer are provided on a lower electrode in this order and a bottom-pinned structure in which a fixing layer, a barrier layer, and a recording layer are provided on a lower electrode in this order. The lower electrode is connected to the drain of the select transistor.

FIG. 1A shows an example of an STT-MRAM having a top-pinned structure, and FIG. 1B shows an example of an STT-MRAM having a bottom-pinned structure. The magnetization direction of the fixing layer is fixed, but the magnetization of the recording layer is reversed.

FIG. 2 shows an example of a SOT-MRAM having a top-pinned structure.

In general, due to characteristics of the select transistor, during writing in the magnetoresistance effect element, there is asymmetry in which the value of the drive current of the select transistor that flows in a direction from the select transistor to the magnetoresistance effect element is smaller than the value of the drive current of the select transistor that flows from the magnetoresistance effect element to the select transistor.

On the other hand, regarding the magnetization reversal of the recording layer during writing in the magnetoresistance effect element, the value of the inversion current required when the magnetization direction is reversed from a parallel state to an antiparallel state is larger than the value of the inversion current required when the magnetization direction is reversed from an antiparallel state to a parallel state.

Therefore, when it is desired to effectively use the drive current of the select transistor as the write current of the magnetoresistance effect element, it is preferable to align a direction in which a large drive current value can be obtained with a magnetization direction in which a large inversion current value is required.

FIG. 3A shows an example in which an STT-MRAM having a top-pinned structure is connected to a select transistor (NMOS).

In addition, FIG. 3B shows the relationship between a magnitude level of a drive current depending on a direction of a current during writing and a magnitude level of a required inversion current depending on a direction of magnetization reversal in an MRAM having a top-pinned structure. As described above, due to characteristics of the select transistor, a drive current that flows in the direction of the drain from the MTJ is larger than a drive current that flows in the direction of the MTJ from the drain. On the other hand, the value of the inversion current required when the magnetization reversal of the recording layer is reversed from a parallel state to an antiparallel state is larger than the value when the magnetization reversal is reversed from an antiparallel state to a parallel state.

Therefore, in the MRAM having a top-pinned structure, based on the correspondence relationship in FIG. 3B, it can be understood that the direction from the MTJ to the drain (direction in which a large drive current flows) and the magnetization direction (before reversal) of the recording layer for which a large inversion current is required are the same direction, and the drive current can be effectively used for magnetization reversal.

Next, FIG. 4A shows an example in which an STT-MRAM having a bottom-pinned structure is connected to a select transistor.

In addition, FIG. 4B shows the relationship between a magnitude level of a drive current depending on a direction of a current during writing and a magnitude level of a required inversion current depending on a direction of magnetization reversal in an MRAM having a bottom-pinned structure. As described above, due to characteristics of the select transistor, a drive current that flows in the direction of the drain from the MTJ is larger than a drive current that flows in the direction of the MTJ from the drain. On the other hand, the value of the inversion current required when the magnetization reversal of the recording layer is reversed from a parallel state to an antiparallel state is larger than the value when the magnetization reversal is reversed from an antiparallel state to a parallel state.

Therefore, in the MRAM having a bottom-pinned structure, based on the correspondence relationship in FIG. 4B, it can be understood that the direction from the MTJ to the drain (direction in which a large drive current flows) and the magnetization direction (before reversal) of the recording layer for which a large inversion current is required are different directions, and the drive current cannot be effectively used for magnetization reversal.

Based on the above, in the top-pinned structure, since the direction from the magnetoresistance effect element to the select transistor (direction in which a large drive current flows) is aligned with the direction of magnetization in a parallel state of the recording layer of the magnetoresistance effect element (direction in which a large inversion current is required), the drive current of the select transistor can be effectively used, and an appropriate margin for the current value can be obtained.

In addition, as a result, there is an advantage that the size of the select transistor can be reduced (refer to Young Min Lee, et. Al., "Highly Scalable STT-MRAM with MTJs of Top-pinned Structure in 1T/1MTJ Cell," 2010 Symposium on VLSI Technology Digest of Technical Papers, 49-50, (2010) and the like). In this respect, the top-pinned structure is more advantageous than the bottom-pinned structure.

Here, when a select transistor of a PMOS is used, the bottom-pinned structure is advantageous as described in Hiroki Koike, et. al., "Wide operational margin capability of 1 kbit spin-transfer-torque memory array chip with 1-PMOS and 1-bottom-pinned-magnetic-tunnel-junction type cell," Jpn. J. Appl. Phys. 53, 04ED13 (2014).

In addition, the fixing layer of the MTJ is required to be sufficiently pinned so that writing and reading in and from the recording layer can be performed accurately. The point of such pinning is to improve an antiferromagnetic coupling between magnetic layers and crystal orientation of the magnetic layer.

In this regard, in the bottom-pinned structure, a thick underlayer (Pt layer) can be disposed on the lower electrode and the crystal orientation of the magnetic layer disposed thereon can be improved, and thus it can be said that pinning is easy.

On the other hand, in the top-pinned structure, since a thick Pt layer (underlayer) cannot be disposed on top of the lower electrode/recording layer/barrier layer, there are problems that the magnetic layer of the fixing layer cannot have sufficient crystal orientation, and sufficient pinning is difficult.

FIG. 34 shows a conventional example of a magnetoresistance effect element having a top-pinned structure, and FIG. 35 shows a conventional example of a magnetoresistance effect element having a bottom-pinned structure.

Moreover, in addition to the various problems described above, the fixing layer of the magnetoresistance effect element is required to be able to maintain sufficient pinning even after an annealing treatment at 300° C. to 400° C. performed in a magnetic memory producing process. Simultaneously, when the magnetization direction of the recording layer of the MTJ is the direction perpendicular to a film surface, it is also required to maintain perpendicular magnetization Here, the annealing treatment in the production of the magnetic memory using the magnetoresistance effect element will be described. As an example of memory production, a method in which a complementary MOS (CMOS) is prepared on a wafer as a substrate, an intermediate wiring is formed on the CMOS to connect with a magnetoresistance effect element, a magnetic film is wired on the top of the intermediate wiring, these are heated, and then a pattern of the magnetoresistance effect element is formed, the magnetoresistance effect element is formed by etching, a protective film is formed, and an upper wiring is formed on the magnetoresistance effect element, cut out into a chip shape, and connected to a predetermined circuit substrate with a wire bonding metal wire, and then sealed with a resin is known. Thus, the magnetic memory including the magnetoresistance effect element having high element performance in a thermal stability index and the like is annealed at about 300° C. to 400° C. after the protective film is formed, and it is necessary to reduce stress or strain of the magnetoresistance effect element, the protective film and the like (refer to WO2018/043377A1).

CITATION LIST

Patent Literature

[PTL 1] WO2018/043377A1

Non Patent Literature

[NPL 1] Young Min Lee, et. Al., "Highly Scalable STT-MRAM with MTJs of Top-pinned Structure in 1T/1MTJ Cell," 2010 Symposium on VLSI Technology Digest of Technical Papers, 49-50, (2010)

[NPL 2] Hiroki Koike, et. Al., "Wide operational margin capability of 1 kbit spin-transfer-torque memory array chip with 1-PMOS and 1-bottom-pinned-magnetic-tunnel-junction type cell," Jpn. J. Appl. Phys. 53, 04ED13 (2014)

SUMMARY OF THE INVENTION

As described above, even after an annealing treatment at 300° C. to 400° C. after a protective film is formed in a magnetic memory producing process, antiferromagnetically coupled magnetic layers in a fixing layer are required to maintain perpendicular magnetic anisotropy and perform strong pinning, but particularly in a magnetoresistance effect element having a top-pinned structure having a layer configuration of a conventional fixing layer, while it is advantageous in the relationship between the direction of the drive current of the select transistor and the inversion current, there is a problem that strong pinning cannot be performed. In the practical use of the magnetic memory, improvement of performance of the magnetoresistance effect element and the problem in the magnetic memory producing process need to be solved at the same time, and the development of a new layer configuration of the fixing layer that can maintain perpendicular magnetic anisotropy even after the annealing treatment at about 400° C. is required.

The present invention has been made in view of the above circumstances and provides a magnetic film, a magnetoresistance effect element and a magnetic memory which maintain perpendicular magnetic anisotropy of magnetic layers, have improved crystal orientation, and allow strong pinning even in an annealing treatment after a protective film is formed.

In order to solve the above problems, the present invention provides a magnetic film including a first magnetic layer (21); a first non-magnetic layer (31) which is provided adjacent to the first magnetic layer (21); a first Pt layer (41) which is provided adjacent to the first non-magnetic layer

(31) on the side opposite to the first magnetic layer (21); and a second magnetic layer (22) which is provided adjacent to the first Pt layer (41) on the side opposite to the first non-magnetic layer (31), wherein the magnetization directions of the first magnetic layer (21) and the second magnetic layer (22) are both a direction perpendicular to a film surface, and an antiferromagnetic coupling is formed between the first magnetic layer (21) and the second magnetic layer (22).

Preferably, the first magnetic layer (21) and the second magnetic layer (22) have an fcc (111) structure.

The first magnetic layer (21) and the second magnetic layer (22) may be Co.

Preferably, the first magnetic layer (21) and the second magnetic layer (22) have a main peak of an X-ray diffraction intensity in an X-ray diffraction spectrum when an angle 2θ, which is twice an angle of X-ray incidence, is 42° or more and 43° or less.

Preferably, the first non-magnetic layer (31) is Ir or Ru.

More preferably, the Ir film thickness of the first non-magnetic layer (31) is 0.5±0.15 nm or 1.35±0.1 nm, and the Ru film thickness is 0.9±0.2 nm or 0.4±0.15 nm.

Preferably, the film thickness of the second magnetic layer (22) is thicker than the film thickness of the first Pt layer (41).

A first adjustment layer (A1) may be disposed on the side of the first magnetic layer (21) opposite to the first non-magnetic layer (31), and the first adjustment layer (A1) may contain Pt Preferably, the magnetic film further includes a second non-magnetic layer (32) which is provided adjacent to the second magnetic layer (22) on the side opposite to the first Pt layer (41); a second Pt layer (42) which is provided adjacent to the second non-magnetic layer (32) on the side opposite to the second magnetic layer (22), and a third magnetic layer (23) which is provided adjacent to the second Pt layer (42) on the side opposite to the second non-magnetic layer (32), wherein the magnetization direction of the third magnetic layer (23) is a direction perpendicular to a film surface, and an antiferromagnetic coupling is formed between the second magnetic layer (22) and the third magnetic layer (23).

Preferably, the magnetic film further includes a third non-magnetic layer (33) which is provided adjacent to the third magnetic layer (23) on the side opposite to the second Pt layer (42), a third Pt layer (43) which is provided adjacent to the third non-magnetic layer (33) on the side opposite to the third magnetic layer (23), and a fourth magnetic layer (24) which is provided adjacent to the third Pt layer (43) on the side opposite to the third non-magnetic layer (33), wherein the magnetization direction of the fourth magnetic layer (24) is a direction perpendicular to a film surface, and an antiferromagnetic coupling is formed between the third magnetic layer (23) and the fourth magnetic layer (24).

Preferably, the magnetic film further includes a fourth non-magnetic layer (34) which is provided adjacent to the fourth magnetic layer (24) on the side opposite to the third Pt layer (43), a fourth Pt layer (44) which is provided adjacent to the fourth non-magnetic layer (34) on the side opposite to the fourth magnetic layer (24), and a fifth magnetic layer (25) which is provided adjacent to the fourth Pt layer (44) on the side opposite to the fourth non-magnetic layer (34), wherein the magnetization direction of the fifth magnetic layer (25) is a direction perpendicular to a film surface, and an antiferromagnetic coupling is formed between the fourth magnetic layer (24) and the fifth magnetic layer (25).

The present invention provides a magnetoresistance effect element including a first fixing layer (P1) including the magnetic film and a first barrier layer (B1), wherein the first barrier layer (B1) is disposed on the side of the first adjustment layer (A1) of the first fixing layer (P1), and the first adjustment layer (A1) is a Co/Pt multilayer film.

The present invention provides a magnetoresistance effect element including a second fixing layer (P2) including the above magnetic film and a second barrier layer (B2), wherein the second barrier layer (B2) is disposed on the side opposite to the first adjustment layer (A1) of the second fixing layer (P2), and the first adjustment layer (A1) is a layer containing Pt as a main element.

Preferably, the magnetoresistance effect element includes the above first fixing layer (P1), the above first barrier layer (B1), a recording layer (F1), the above second barrier layer (B2), and the above second fixing layer (P2), wherein the first barrier layer (B1) is provided adjacent to the side of the first adjustment layer (A1) of the first fixing layer (P1), the recording layer (F1) is provided adjacent to the first barrier layer (B1) on the side opposite to the first fixing layer (P1), the second barrier layer (B2) is provided adjacent to the recording layer (F1) on the side opposite to the first barrier layer (B1), and the second fixing layer (P2) may be provided adjacent to the second barrier layer (B2) on the side opposite to the recording layer (F1).

A magnetic memory of the present invention includes the magnetoresistance effect element.

In addition, in a magnetic film, a magnetoresistance effect element, and a magnetic memory of the present invention, the order of the first non-magnetic layer (31) and the first Pt layer (41) laminated, and/or the order of the second non-magnetic layer (32) and the second Pt layer (42) laminated, and/or the order of the third non-magnetic layer (33) and the third Pt layer (43) laminated, and/or the order of the fourth non-magnetic layer (34) and the fourth Pt layer (44) laminated included in the magnetic film, the magnetoresistance effect element, and the magnetic memory are reversed.

According to the present invention, it is possible to provide a magnetic film, a magnetoresistance effect element including the magnetic film, and a magnetic memory including the magnetoresistance effect element which can maintain an antiferromagnetic coupling of magnetic layers in a fixing layer even after an annealing treatment is performed at about 300° C. to 400° C. after a protective film is formed in order to reduce stress or strain of the magnetoresistance effect element, the protective film, or the like in production of the magnetic memory using the magnetoresistance effect element. That is, when an Pt layer is additionally inserted between a non-magnetic layer and a magnetic layer in the fixing layer, even if an annealing treatment is performed after the protective film is formed, an antiferromagnetic coupling between the magnetic layers is maintained and the crystal orientation and perpendicular magnetic anisotropy of the magnetic layer are also maintained, strong pinning is possible, and the magnetoresistance effect element performance can be maintained for the magnetic memory.

BRIEF DESCRIPTION OF THE DRAWINGS

FIG. 19 shows a layer configuration used for evaluating heat resistance of a magnetoresistance effect element having a bottom-pinned structure.

FIG. 25 is a longitudinal cross-sectional view of an example of a magnetic film of the present invention.

FIG. 26 is a longitudinal cross-sectional view of an example of a magnetic film of the present invention.

In FIG. 36A, a non-magnetic layer is disposed on the side of an adjustment layer, and a Pt layer is disposed on the non-magnetic layer. In FIG. 36B, a Pt layer is disposed on the side of an adjustment layer, and a non-magnetic layer is disposed on the Pt layer.

FIG. 37A shows a magnetization curve of an evaluation element of FIG. 36A, and FIG. 37B show magnetization curves of an evaluation element of FIG. 36A.

DESCRIPTION OF THE PREFERRED EMBODIMENTS

Figure 1A:
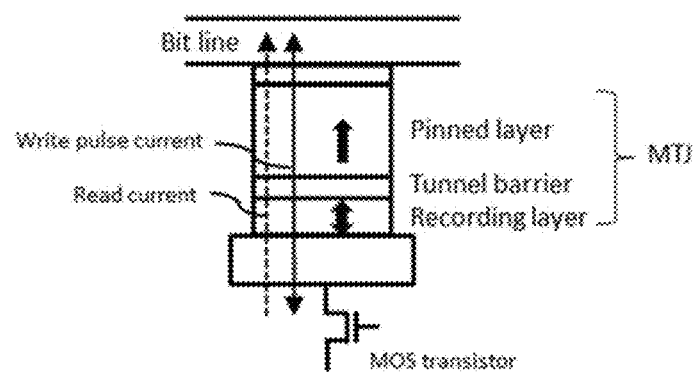
FIG. 1A shows a top-pinned structure of an STT-MRAM, and FIG. 1 B shows an outline of a bottom-pinned structure of the STT-MRAM.
Figure 1B:
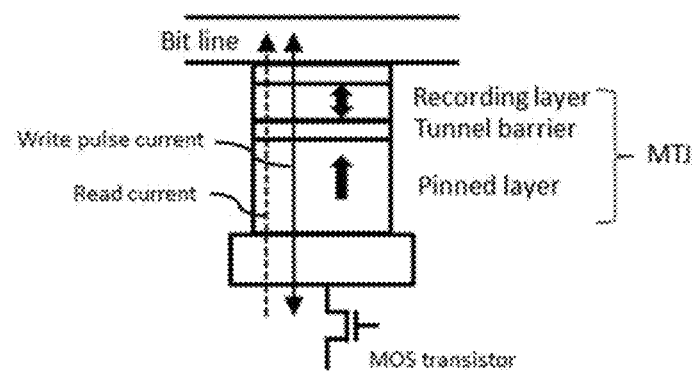
Figure 2:
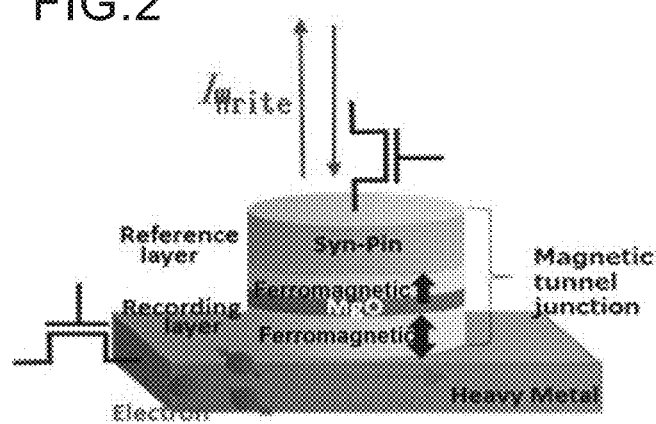
FIG. 2 shows an outline of a SOT-MRAM.
Figure 3A:
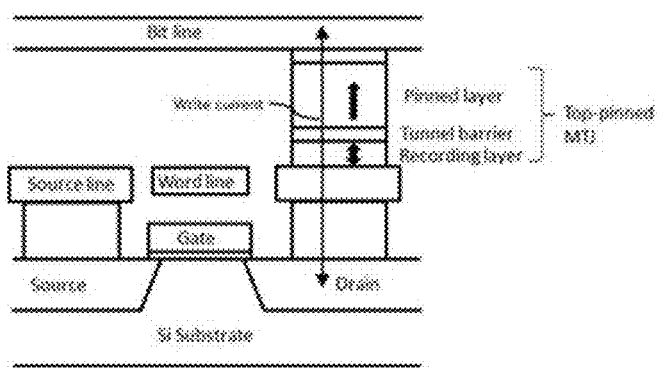
FIG. 3A shows a top-pinned structure.
Figure 3B:
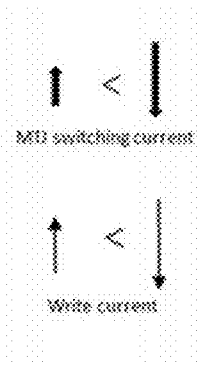
FIG. 3B shows the relationship between a magnitude level of a drive current depending on a direction of a current during writing and a magnitude level of a required inversion current depending on a direction of magnetization reversal in an MRAM having a top-pinned structure.
Figure 4A:
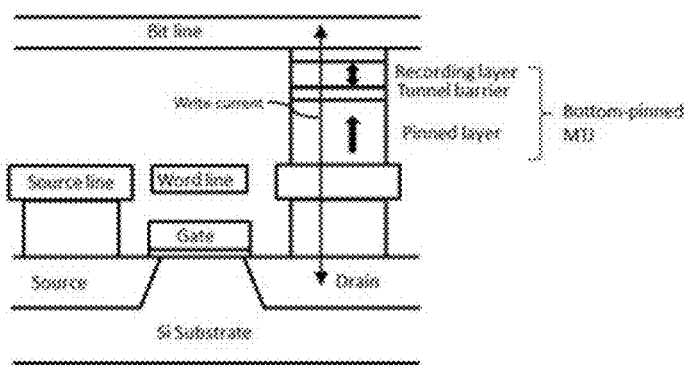
FIG. 4A shows a bottom-pinned structure.
Figure 4B:
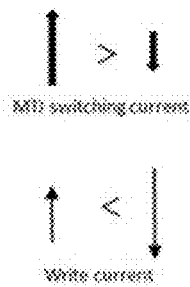
FIG. 4B shows the relationship between a magnitude level of a drive current depending on a direction of a current during writing and a magnitude level of a required inversion current depending on a direction of magnetization reversal in an MRAM having a bottom-pinned structure.

Hereinafter, a magnetic film, a magnetoresistance effect element and a magnetic memory of the present invention will be described in detail with reference to the drawings.

Here, the drawings are only an example, and will be described with reference numerals, and do not limit the present invention.

Embodiment 1

Figure 5:
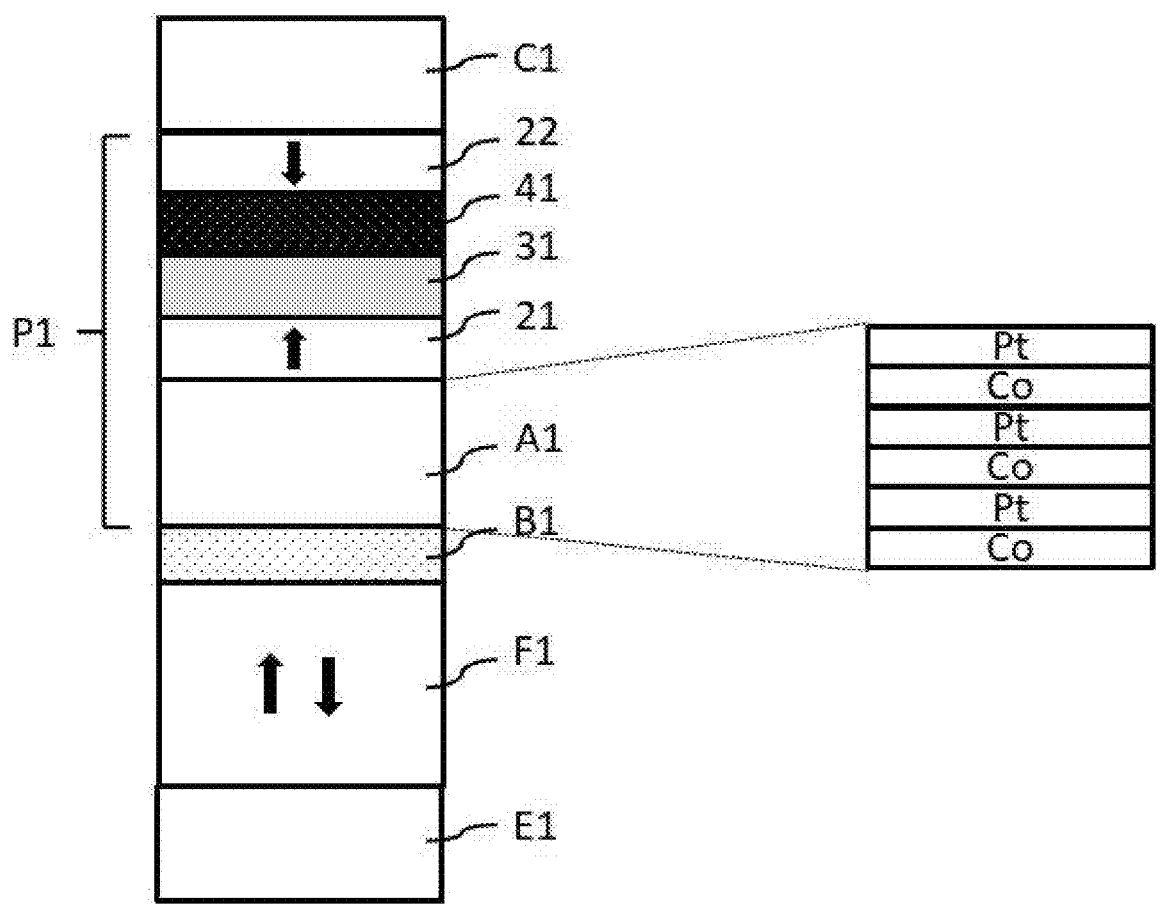
FIG. 5 is a longitudinal cross-sectional view of an example of a magnetoresistance effect element of the present invention.

FIG. 5 shows a basic configuration of Embodiment 1 of the present invention. In the basic configuration of the magnetoresistance effect element, a lower electrode (E1)/a recording layer (F1)/a first barrier layer (B1)/a first adjustment layer (A1)/a first magnetic layer (21)/a first non-magnetic layer (31)/a first Pt layer (41)/a second magnetic layer (22)/a cap layer (C1) are disposed adjacent to each other in this order. The first adjustment layer (A1)/the first magnetic layer (21)/the first non-magnetic layer (31)/the first Pt layer (41)/the second magnetic layer (22) form a first fixing layer (P1).

Since the first fixing layer (P1) is disposed on the lower electrode (E1), the recording layer (F1), and the first barrier layer (B1), the configuration of Embodiment 1 is a part or all of the magnetoresistance effect element having a top-pinned structure.

The magnetization directions of the first magnetic layer (21) and the second magnetic layer (22) are both a direction perpendicular to a film surface, and an antiferromagnetic coupling is formed between the first magnetic layer (21) and the second magnetic layer (22).

The first magnetic layer (21) and the second magnetic layer (22) contain any of Co, Fe, and Ni.

In addition, the first magnetic layer (21) and the second magnetic layer (22) may further contain non-magnetic elements such as W, Ta, Hf, Zr, Nb, Mo, Ti, V, Cr, Si, Al, B, Pd, and Pt.

Specific examples include Co, Fe, Ni, CoFe, FeNi, CoNi, and CoB, and Co is more preferable because in this case an antiferromagnetic coupling is formed between two magnetic layers with the first non-magnetic layer (31) and the first Pt layer (41) to be described below therebetween, and the magnetization directions of the two magnetic layers tend to be a direction perpendicular to the film surface.

The film thicknesses of the first magnetic layer (21) and the second magnetic layer (22) each are preferably in a range of 0.3 nm to 3.0 nm and more preferably in a range of 0.5 nm to 1.1 nm. This is because stable ferromagnetism cannot be obtained when the film thickness is thinner, but an antiferromagnetic coupling is significantly weaker when the film thickness is thicker than 3 nm.

In addition, the first magnetic layer (21) and the second magnetic layer (22) may be composed of a plurality of layers. For example, multilayer films such as Co/Pt/Co or Co/Pt/Co/Pt/Co may be used.

In addition, the film thickness of the second magnetic layer (22) is preferably thicker than the film thickness of the first Pt layer (41) to be described below.

The crystal structure of the first magnetic layer (21) and the second magnetic layer (22) preferably has an fcc (111) structure (face-centered cubic). This is because the perpendicular magnetic anisotropy is easily maintained when the crystal orientation is higher.

In addition, when the main element of the first magnetic layer (21) and/or the second magnetic layer (22) is Co, in an X-ray diffraction spectrum, it is desirable to have a main peak of an X-ray diffraction intensity when an angle 2θ, which is twice an angle of X-ray incidence, is 42° or more and 43° or less. When the peak of the spectrum appears when 2θ is 42° or more and 43° or less, the lattice constant of Co is almost the same as that of bulk Co(111). The inventors have found that perpendicular magnetic anisotropy becomes stronger when there is not much Co strain.

In the first non-magnetic layer (31), the magnetic layers are antiferromagnetically coupled by the element film constituting the non-magnetic layer, and the interlayer exchange coupling energy between the magnetic layers, that is, the antiferromagnetic coupling force, is adjusted by the constituent elements and their film thickness. Examples of materials whose interlayer exchange coupling energy changes depending on the film thickness include such as Ir, Ru, Rh, and Os.

The first non-magnetic layer (31) may also contain other elements using these alloys as long as the crystal structure does not change. For example, Ta, B, Nb, and V and the like may be exemplified.

The film thickness of the first non-magnetic layer (31) is desirably adjusted to 0.5±0.15 nm or 1.35±0.1 nm, which shows peak positions of the antiferromagnetic coupling strength, when Ir is contained as the main element.

The film thickness of the first non-magnetic layer (31) is desirably adjusted to 0.9±0.2 nm or 0.4±0.15 nm, which shows peak positions of antiferromagnetic coupling strength, when Ru is contained as the main element.

The first Pt layer (41) contains Pt as the main element and is inserted adjacently between the first non-magnetic layer (31) and the second magnetic layer (22).

The film thickness of the first Pt layer (41) is preferably in a range of 0.1 nm to 0.9 nm and more preferably in a range of 0.25 nm to 0.7 nm. Here, the film thickness of the first Pt layer (41) is preferably thinner than the film thickness of the second magnetic layer (22).

The first adjustment layer (A1) of the first fixing layer (P1) is more desirably a multilayer film which contains Pt and in which a plurality of Co/Pt are laminated. As shown in FIG. 5, the Pt layer among the Co/Pt multilayer films of the first adjustment layer (A1) is disposed so that it is inserted between Co films. Here, the layer adjacent to the first magnetic layer (21) may be a Pt layer. In addition, it may contain other elements as long as the properties of the crystal structure and/or layers do not change.

The film thickness of Co among the Co/Pt multilayer films of the first adjustment layer (A1) is preferably in a range of 0.2 nm to 0.7 nm and more preferably in a range of 0.2 nm to 0.4 nm. The film thickness of Pt is preferably in a range of 0.4 nm to 1.1 nm and more preferably in a range of 0.6 nm to 0.9 nm. In addition, among the Co/Pt multilayer films of the first adjustment layer (A1), the film thickness of Pt is preferably thicker than the film thickness of Co.

Here, among the Co layers in the first adjustment layer (A1), the film thickness of the Co layer adjacent to the first barrier layer (B1) is preferably in a range of 0.3 nm to 1.6 nm and more preferably in a range of 0.5 nm to 1.4 nm, regardless of the above range.

The cap layer (C1) is a layer which is provided on the side opposite to the first barrier layer (B1) of the first fixing layer (P1) and includes an upper electrode, and electrically connects the first fixing layer (P1) of the magnetoresistance effect element to a bit line of a select transistor.

In addition, in the cap layer (C1), in addition to the upper electrode, a non-magnetic layer or the like required for improving characteristics of the magnetoresistance effect element can be appropriately formed between the upper electrode and the first fixing layer (P1).

The first barrier layer (B1) is a tunnel barrier layer which is disposed on the side of the first adjustment layer (A1) of the first fixing layer (P1) and composed of an insulation layer, and forms a magnetic tunnel junction between the first fixing layer (P1) and the recording layer (F1) to be described below. An insulator such as MgO, $Al_2O_3$, $SiO_2$, TiO, $Hf_2O$, or ScC is used, and MgO or ScC is preferably used so that a large magnetoresistance change rate is exhibited by combining materials of two end surfaces.

In order to increase the TMR ratio, the film thickness of the first barrier layer (B1) is preferably 0.5 nm or more and more preferably 0.8 nm or more. In addition, in order to reverse the magnetization with a small write current $I_C$, the film thickness is preferably 2.0 nm or less and more preferably 1.2 nm or less. Therefore, the film thickness is adjusted to be within a range of 0.5 to 2.0 nm and more preferably in a range of 0.8 to 1.2 nm.

The recording layer (F1) is disposed adjacent to the first barrier layer (B1) on the side opposite to the first fixing layer (P1) and the magnetization direction is a direction perpendicular to a film surface.

The recording layer (F1) contains at least one of Co, Fe, and Ni.

In addition, the recording layer (F1) may further contain non-magnetic elements such as W, Ta, Hf, Zr, Nb, Mo, Ti, V, Cr, Si, Al, B, Pd, and Pt.

Specific examples include such as Co, Fe, Ni, CoFe, FeNi, CoNi, CoB, FeB, NiB, and CoFeB, and CoFeB and FeB are more preferable. In addition, the recording layer (F1) may be a Co/Pt multilayer film.

Here, the recording layer (F1) desirably has perpendicular magnetic anisotropy due to interface magnetic anisotropy with the first barrier layer (B1). In addition, for the recording layer (F1), one or more non-magnetic insertion layers such as W, Ta, and Mo may be inserted, a layer such as MgO may be inserted to increase the interface, and the perpendicular magnetic anisotropy may be further improved.

The lower electrode (E1) is disposed on the side of the recording layer (F1) opposite to the first barrier layer (B1). The lower electrode (E1) is electrically connected to a select transistor (not shown) and the magnetoresistance effect element receives a current supply from the select transistor to write and read.

Figure 6:
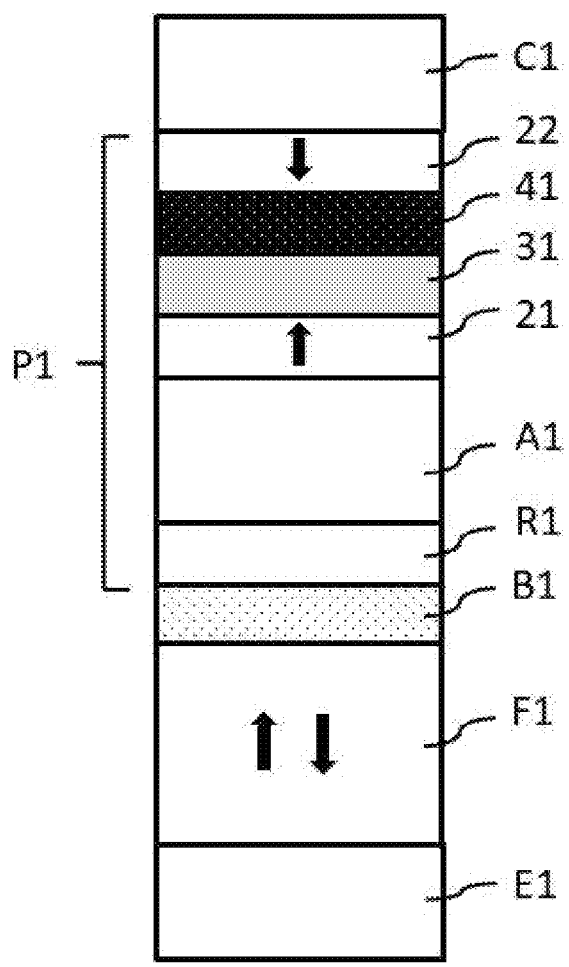
FIG. 6 is a longitudinal cross-sectional view of an example of a magnetoresistance effect element of the present invention.
Figure 8:
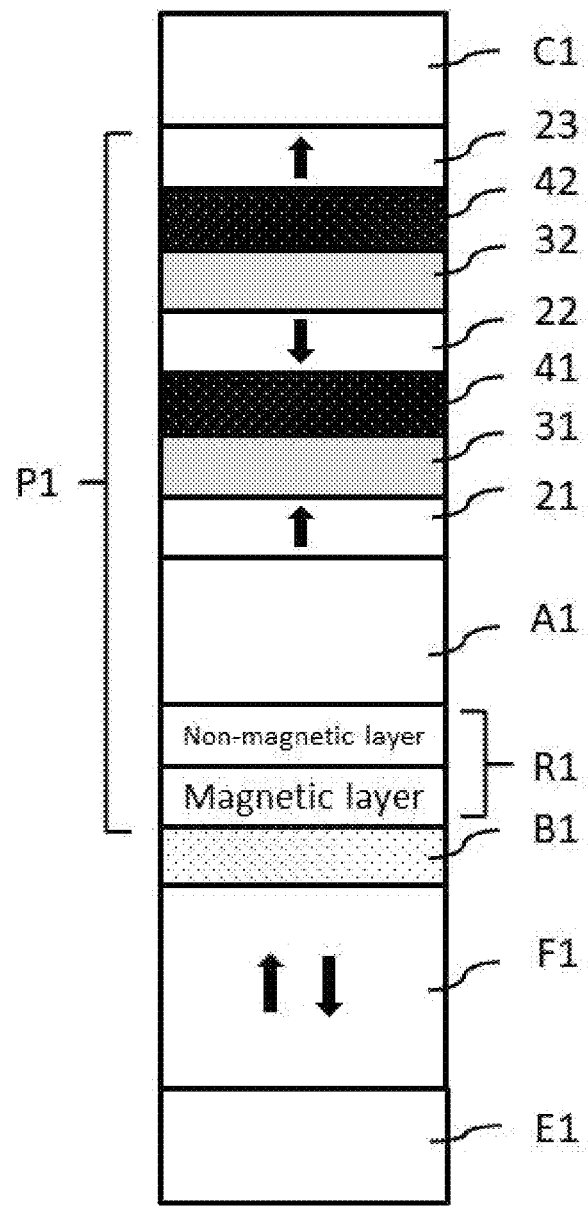
FIG. 8 is a longitudinal cross-sectional view of an example of a magnetoresistance effect element of the present invention.

Here, in Embodiment 1, as shown in FIG. 6 and FIG. 8, a first reference layer (R1) may be provided between the first barrier layer (B1) and the first adjustment layer (A1).

The first reference layer (R1) is inserted in order to improve characteristics of the magnetoresistance effect element, particularly, the TMR ratio.

The first reference layer (R1) contains a magnetic layer and a non-magnetic layer, the magnetic layer is adjacent to the first barrier layer (B1), and the non-magnetic layer is adjacent to the first adjustment layer (A1).

The magnetic layer contains at least one of Co, Ni, and Fe.

In addition, the magnetic layer of the first reference layer (R1) may further contain non-magnetic elements such as W, Ta, Hf, Zr, Nb, Mo, Ti, V, Cr, Si, Al, B, Pd, and Pt.

Specific examples include such as Co, Fe, Ni, CoFe, FeNi, CoNi, CoB, FeB, NiB, and CoFeB, and CoFeB and FeB are more preferable.

The film thickness of the magnetic layer of the first reference layer (R1) is preferably in a range of 0.3 nm to 3.0 nm and more preferably in a range of 1.0 nm to 1.4 nm.

In order to improve the crystal orientation of the magnetic layer of the first adjustment layer (A1) and the like, the non-magnetic layer of the first reference layer (R1) is inserted between the magnetic layer of the first reference layer (R1) and the first adjustment layer (A1).

The non-magnetic layer of the first reference layer (R1) contains, for example, Ta, W, or Mo, and the film thickness thereof is about 0.3 nm. The magnetic layer of the first reference layer (R1) and the magnetic layer adjacent to the first reference layer (R1) of the first adjustment layer (A1) are magnetically coupled.

Figure 7:
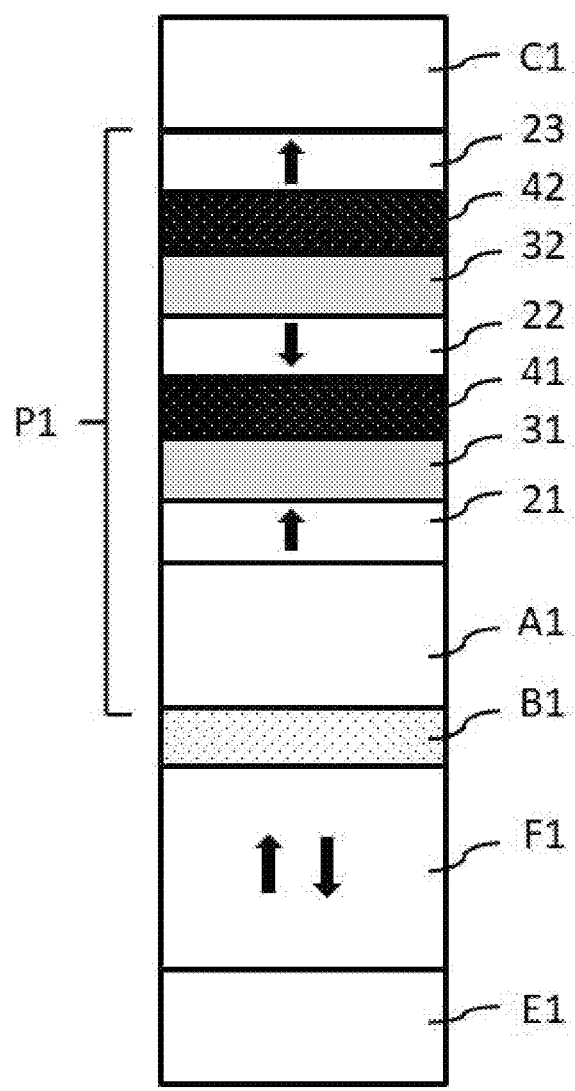
FIG. 7 is a longitudinal cross-sectional view of an example of a magnetoresistance effect element of the present invention.

In addition, in Embodiment 1, as shown in FIG. 7 and FIG. 8, one set or two or more sets of the non-magnetic layer/Pt layer/magnetic layer may be additionally disposed adjacent to the second magnetic layer (22) on the side opposite to the first Pt layer (41). An antiferromagnetic coupling is formed between the second magnetic layer (22) and a third magnetic layer (23) of the first fixing layer (P1), and between the third magnetic layer (23) and a fourth magnetic layer (24).

Features of Embodiment 1 will be described.

Figure 34:
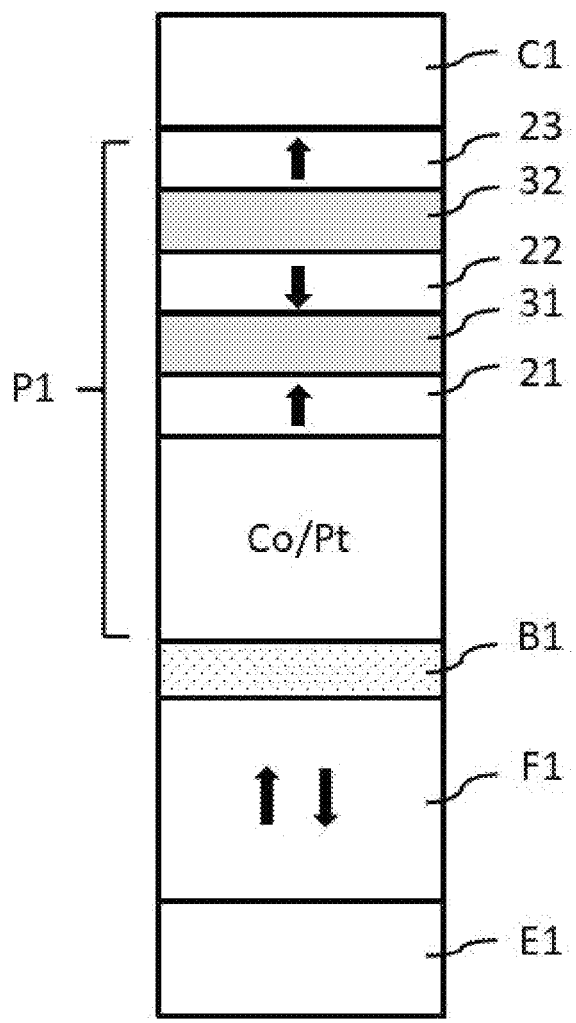
FIG. 34 is a conventional example of a magnetoresistance effect element having a top-pinned structure.
Figure 35:
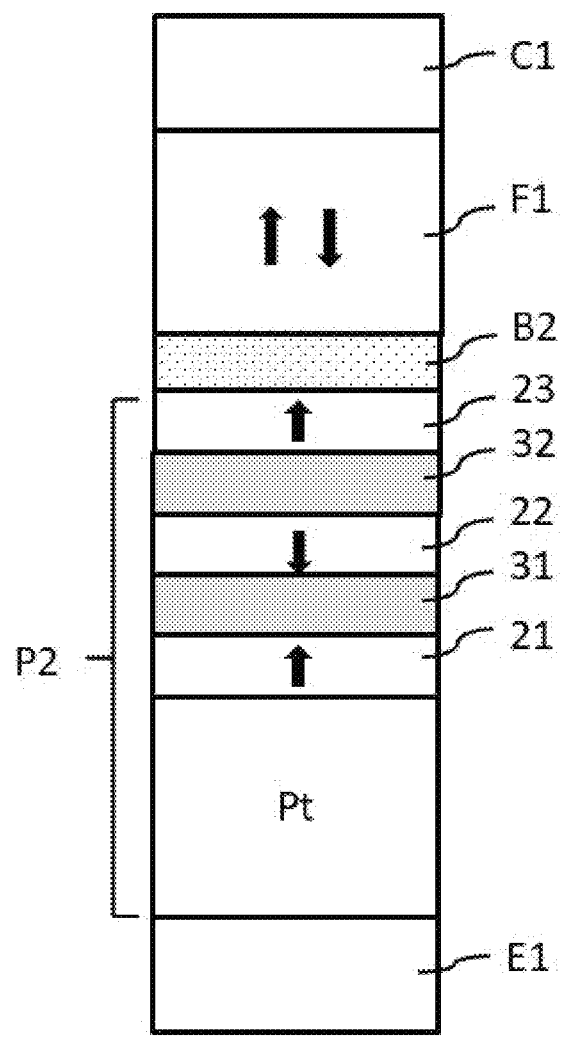
FIG. 35 is a conventional example of a magnetoresistance effect element having a bottom-pinned structure.

First, as described in the background art, in order to generate an antiferromagnetic coupling between magnetic layers, generally, the magnetic layer and the non-magnetic layer are disposed adjacent to each other (refer to FIG. 34 as a conventional example). However, in the case of the conventional layer configuration, particularly after the annealing treatment at 300° C. to 400° C., it is difficult to maintain the perpendicular magnetic anisotropy and the antiferromagnetic coupling.

In the present invention, the crystal orientation of the magnetic layer is improved by inserting the Pt layer between the magnetic layer and the non-magnetic layer, which is between the magnetic layers forming an antiferromagnetic coupling, and even after the annealing treatment at 300° C. to 400° C., the perpendicular magnetic anisotropy and the antiferromagnetic coupling are maintained (the same applies to other embodiments).

Figure 11:
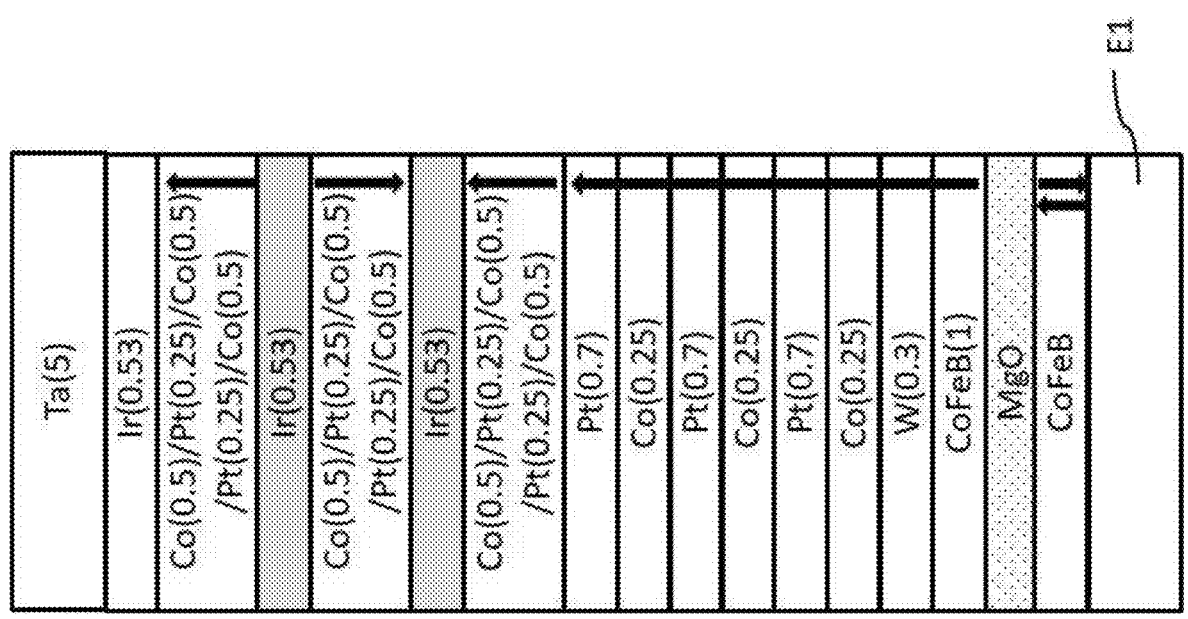
FIG. 11 shows a layer configuration used for evaluating heat resistance of a magnetoresistance effect element having a top-pinned structure according to a comparative example.

In addition, in order to perform sufficient pinning with the conventional layer configuration, a multilayer film with an increased number of laminated magnetic layers forming an antiferromagnetic coupling such as Co/Pt/Co/Pt/Co as in FIG. 11 are necessary, but on the other hand, the first magnetic layer and the second magnetic layer to be antiferromagnetically coupled in the present invention can maintain the perpendicular magnetic anisotropy and antiferromagnetic coupling even with one magnetic layer such as a Co layer, and the number of magnetic layers that are laminated can be significantly reduced (the same applies to other embodiments).

Here, as will be described below, even in the conventional example in FIG. 11, it is difficult to obtain the perpendicular magnetic anisotropy and antiferromagnetic coupling by annealing at 400° C.

Hereinafter, the evaluation results of Embodiment 1 will be described.

Evaluation Test 1

The perpendicular magnetic anisotropy of the magnetoresistance effect element of Embodiment 1 was evaluated.

Figure 9:
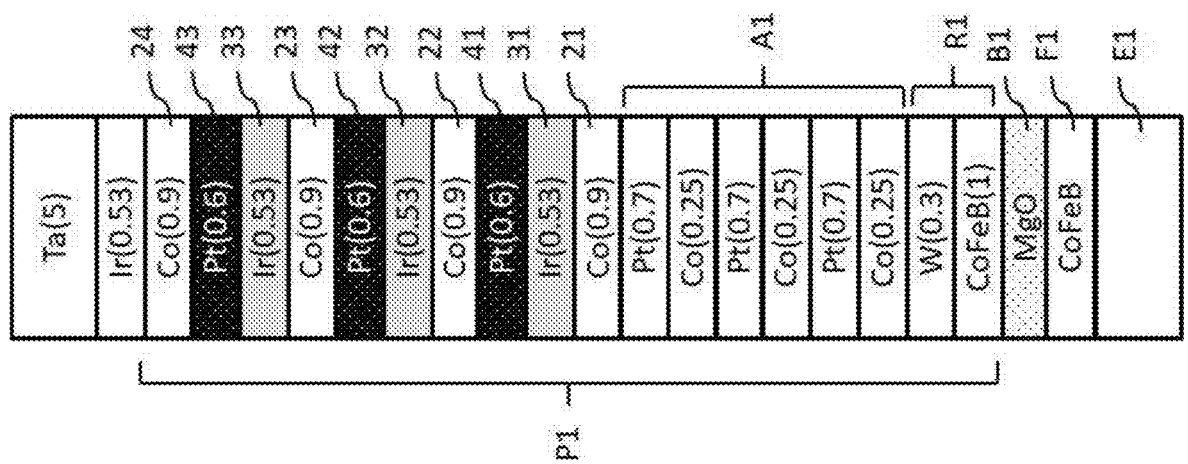
FIG. 9 shows a configuration of a film used for evaluating heat resistance of a magnetic film having a top-pinned structure.

FIG. 9 shows the layer configuration used for evaluation. The configuration was the lower electrode/CoFeB/MgO/CoFeB(1)/W(0.3)/Co(0.25)/Pt(0.7)/Co(0.25)/Pt(0.7)/Co(0.25)/Pt(0.7)/Co(0.9)/Ir(0.53)/Pt(0.6)/Co(0.9)/Ir(0.53)/Pt(0.6)/Co(0.9)/Ir(0.53)/Pt(0.6)/Co(0.9)/Ir(0.53)/Ta(5), and the number in parentheses indicates the film thickness (nm). Among the fixing layers of the evaluation element, the Pt layers (41, 42, and 43) were inserted between the magnetic layers (22, 23, and 24) disposed on the non-magnetic layers (31, 32, and 33).

An evaluation element in FIG. 9 was prepared and annealed at 300° C., 350° C. and 400° C. for 1 hour.

Figure 10A:
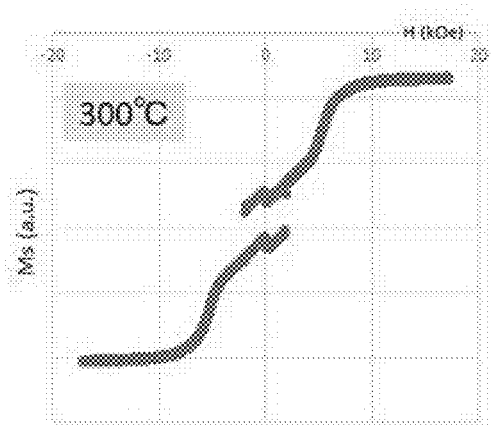
FIG. 10A to FIG. 10C show evaluation results of heat resistance of a magnetic film having a top-pinned structure.
Figure 10B:
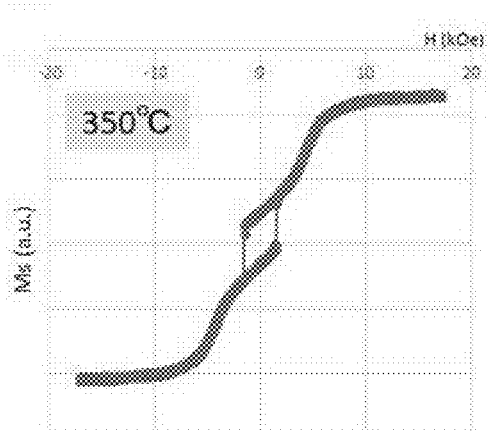
Figure 10C:
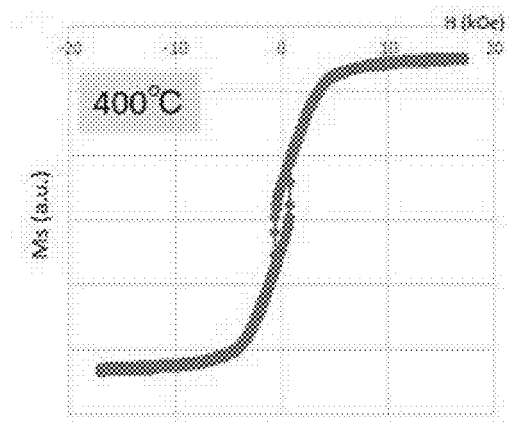

Magnetization curves (magnetization versus field curves) obtained from the evaluation films are shown in FIG. 10A to FIG. 10C. Here, the magnetization curve with a vertical axis representing a product Mt of the magnetization and the film thickness and with a horizontal axis representing a product $\mu_0 H$ of the vacuum permeability and the magnetic field was obtained by sweeping the magnetic field in the direction perpendicular to a film surface. When the element had perpendicular magnetic anisotropy, a substantially vertical loop was obtained when $\mu_0 H$ was near zero. In addition, the magnetic layers with the non-magnetic layer and the Pt layer therebetween were antiferromagnetically coupled, additionally, the product Mt of the magnetization and the film thickness was smaller in the vicinity of the zero magnetic field, and a substantially vertical loop was obtained near zero.

Figure 12A:
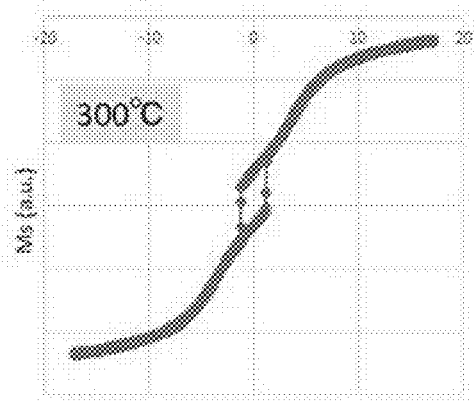
FIG. 12A to FIG. 12C show the evaluation results of heat resistance of a magnetoresistance effect element having a top-pinned structure according to a comparative example.
Figure 12B:
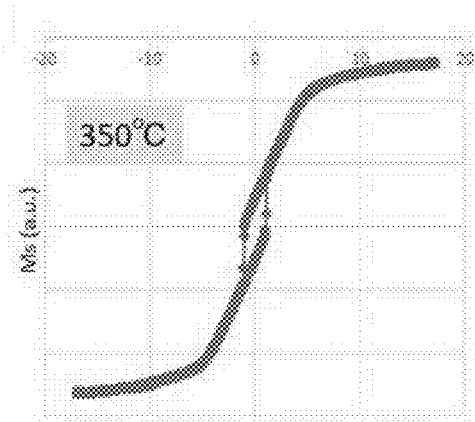
Figure 12C:
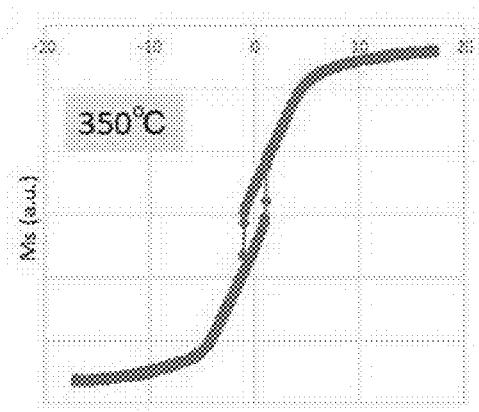

In addition, although not shown here, the M-H loop when a magnetic field was applied in the plane, a substantially vertical loop was not obtained in the zero magnetic field, and a curve as shown in FIG. 12C was shown.

In FIG. 10A to FIG. 10C, when the annealing treatment temperature was 300° C., 350° C., or 400° C., the product Mt of the magnetization and the film thickness was smaller in the vicinity of the zero magnetic field, and a substantially vertical loop was shown near zero, and it was confirmed that the magnetic layer exhibited the perpendicular magnetic anisotropy and antiferromagnetic coupling.

Evaluation Test 2

The perpendicular magnetic anisotropy of the magnetoresistance effect element having a layer configuration as a comparative example of Embodiment 1 was evaluated.

FIG. 11 shows the layer configuration used for evaluation of a comparative example. The configuration was the lower electrode/CoFeB/MgO/CoFeB(1)/W(0.3)/Co(0.25)/Pt(0.7)/Co(0.25)/Pt(0.7)/Co(0.25)/Pt(0.7)/Co(0.5)/Pt(0.25)/Co(0.5)/Pt(0.25)/Co(0.5)/Ir(0.53)/Co(0.5)/Pt(0.25)/Co(0.5)/Pt(0.25)/Ir(0.53)/Co(0.5)/Pt(0.25)/Co(0.5)/Pt(0.25)/Co(0.5)/Ir(0.53)/Ta(5), and the number in parentheses indicates the film thickness (nm). The evaluation element of the comparative example had a magnetic layer (Co layer in the evaluation element) adjacent to and directly above the non-magnetic layer (Ir in the evaluation element) and had a configuration of the non-magnetic layer/magnetic layer, and did not have a configuration of the non-magnetic layer/Pt layer/magnetic layer as in Embodiment 1.

An evaluation element in FIG. 11 was prepared and annealed at 300° C., 350° C. and 400° C. for 1 hour.

Magnetization curves obtained from the evaluation films are shown in FIG. 12A to FIG. 12C.

In FIG. 12A and FIG. 12B, when the annealing treatment temperature was 300° C. or 350° C., it was confirmed that the magnetic layer exhibited perpendicular magnetic anisotropy and an antiferromagnetic coupling between the magnetic layers of the fixing layer was confirmed. However, in FIG. 12C, since a substantially vertical loop was not obtained in the zero magnetic field, no perpendicular magnetic anisotropy was confirmed at 400° C. Although not shown here, it was understood that, at 400° C., when an external magnetic field was applied in the plane, since a substantially vertical loop was obtained in the zero magnetic field, an in-plane magnetized film was formed. In addition, the antiferromagnetic coupling between the magnetic layers of the fixing layer was not confirmed.

That is, unlike Embodiment 1, in the configuration in FIG. 11 in which no Pt layer was inserted under the magnetic layer, which was between the magnetic layers forming an antiferromagnetic coupling, and the magnetic layer was adjacent to both sides of the non-magnetic layer, it was understood that the perpendicular magnetic anisotropy was not maintained by the annealing treatment at 400° C. and the magnetic layers of the fixing layer were not antiferromagnetically coupled.

In addition, as in this comparative example, generally, it was necessary to prepare a multilayer structure of Co/Pt in order to prepare a perpendicular magnetic film. When the multilayer structure was prepared in this manner, in a production device, in order to secure throughput, cathodes corresponding to the number of layers of Co and Pt were prepared. Therefore, as the number of layers increased, the production cost increased. On the other hand, the present invention was also advantageous in terms of production cost because a stronger antiferromagnetic coupling could be formed in a vertical film even if the number of layers was small.

Evaluation Test 3

The crystal orientation of the magnetoresistance effect element of Embodiment 1 was evaluated.

An evaluation element of FIG. 9 was prepared and annealed at 400° C. for 1 hour.

Figure 13:
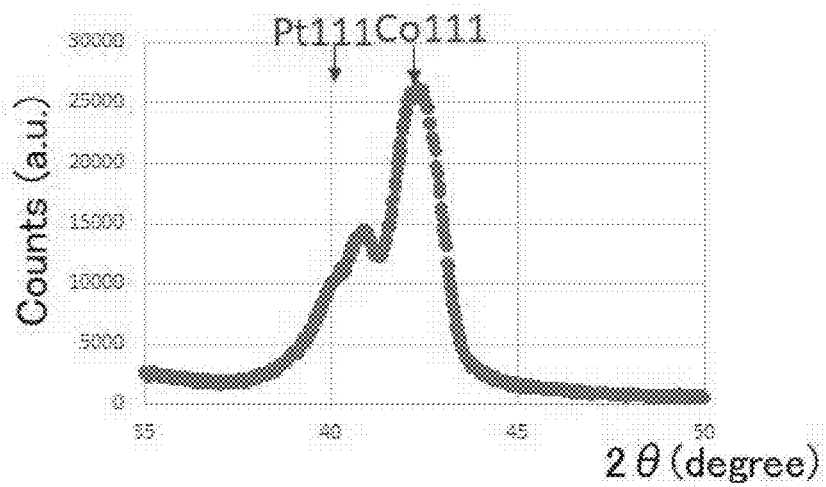
FIG. 13 shows an X-ray diffraction spectrum of an antiferromagnetically coupled magnetic layer (Co) in a fixing layer having a top-pinned structure.

FIG. 13 shows an X-ray diffraction spectrum obtained from the evaluation element. Here, the X-ray diffraction spectrum shows an X-ray diffraction intensity (arbitrary scale) with respect to twice (2θ) the angle of incidence (θ) of X rays on the sample, and 2θ at which the diffraction peak appears depends on the crystal structure.

In FIG. 13, it was understood that, when focusing on the second magnetic layer having a main peak at 42.3° (2θ), and mainly having an fcc (111) structure, the crystal orientation of the second magnetic layer (22) could be improved with the first Pt layer (41) inserted adjacently under the second magnetic layer (22). In addition, it can be understood from the diffraction peak that the lattice constant of Co is almost the same as that of bulk Co(111). In this manner, it can be understood that perpendicular magnetic anisotropy becomes stronger when there is not much Co strain.

Here, although not shown, it was understood that, when analyzed together with the results of evaluation elements having other configurations, if the film thickness of the second magnetic layer (22) was thicker than the film thickness of the first Pt layer (41), the crystal orientation of the second magnetic layer (22) could be further improved, and since a main X-ray diffraction peak was shown at an angle of X-ray incidence 2θ of 42° or more and 43° or less, the crystal structure of Co was mainly the fcc (111) structure.

In this manner, it was understood that the element having the configuration of Embodiment 1 could improve the crystal orientation of the magnetic layer, and thus it easily maintained the perpendicular magnetic anisotropy and easily became a perpendicular magnetic film.

Evaluation Test 4

As a comparative example of Embodiment 1, the X-ray diffraction spectrum in the case of a layer configuration having a low crystal orientation was confirmed.

Figure 14:
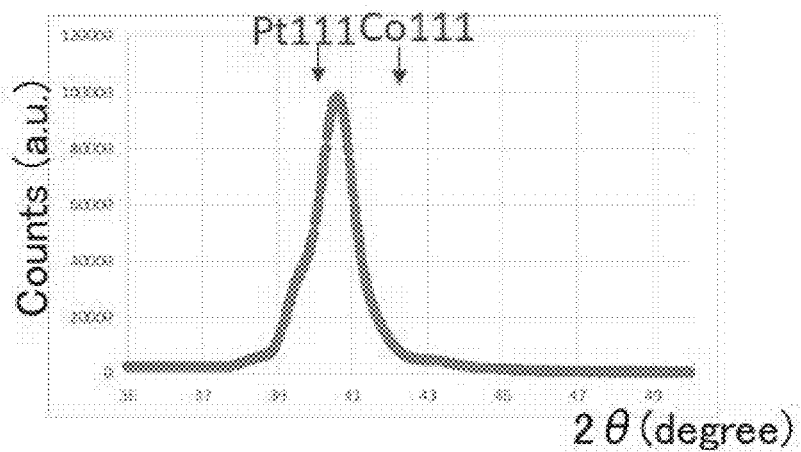
FIG. 14 shows an example of an X-ray diffraction spectrum of Co having low crystal orientation.

FIG. 14 shows an example of an X-ray diffraction spectrum of a magnetoresistance effect element in which the magnetization easy axis of the magnetic layer is in the in-plane direction.

In FIG. 14, it was understood that there was a main peak at 40.6° (2θ), the lattice of Co of the fcc (111) structure was dragged by Pt and strained, and the lattice constant of Co was longer in the direction perpendicular to a film surface. The inventors have found that, when such strain occurred, the magnetization direction of Co was unlikely to be vertical.

That is, it was clearly understood that, unlike the element whose magnetization direction was a direction perpendicular to a film surface as in Evaluation Test 3, when the magnetization easy axis of the magnetic layer was the in-plane direction, there was no main X-ray diffraction peak at an angle of X-ray incidence 2θ of 42° or more and 43° or less, and the magnetization direction of Co was unlikely to be vertical.

Embodiment 2

Figure 15:
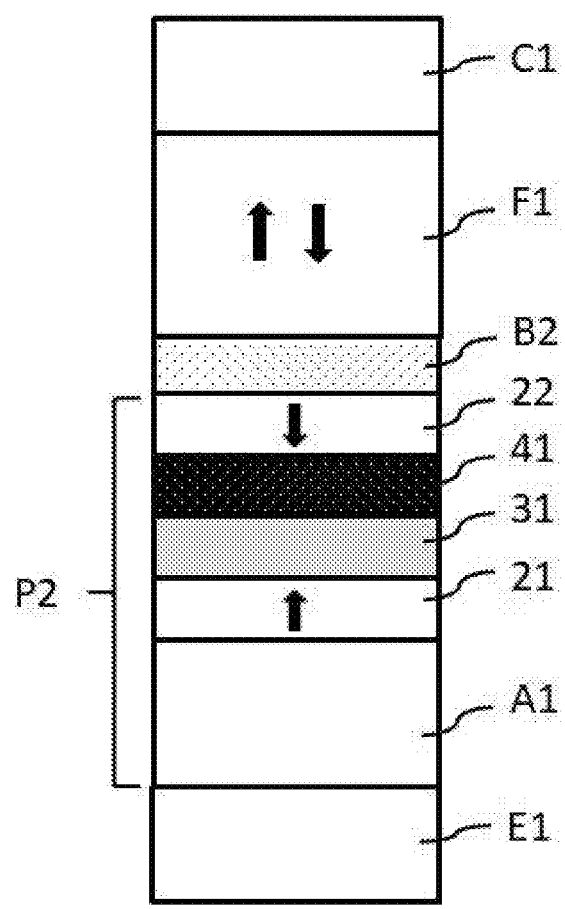
FIG. 15 is a longitudinal cross-sectional view of an example of a magnetoresistance effect element of the present invention.

FIG. 15 shows a basic configuration of Embodiment 2 of the present invention. In the basic configuration of the magnetoresistance effect element, the lower electrode (E1)/the first adjustment layer (A1)/the first magnetic layer (21)/the first non-magnetic layer (31)/the first Pt layer (41)/the second magnetic layer (22)/a second barrier layer (B2)/the recording layer (F1)/the cap layer (C1) are disposed in this order. The first adjustment layer (A1)/the first magnetic layer (21)/the first non-magnetic layer (31)/the first Pt layer (41)/the second magnetic layer (22) form a second fixing layer (P2).

Since the second fixing layer (P2), the second barrier layer (B2), and the recording layer (F1) are disposed on the lower electrode (E1) in this order, the configuration of Embodiment 2 is a part or all of the magnetoresistance effect element having a bottom-pinned structure.

The magnetization directions of the first magnetic layer (21) and the second magnetic layer (22) are both a direction perpendicular to a film surface, and an antiferromagnetic coupling is formed between the first magnetic layer (21) and the second magnetic layer (22).

Desirably, the first adjustment layer (A1) included in the bottom-pinned structure contains Pt and is a Pt layer. In this case, the film thickness of the first adjustment layer (A1) is preferably 3 nm or more, and more preferably 5 nm or more. Here, the first adjustment layer (A1) may be referred to as an underlayer.

In the first non-magnetic layer (31) of the second fixing layer (P2), the magnetic layers are antiferromagnetically coupled by the element film constituting the non-magnetic layer, and the interlayer exchange coupling energy between the magnetic layers, that is, the antiferromagnetic coupling force, is adjusted by the constituent elements and their film thickness. Examples of materials whose interlayer exchange coupling energy changes depending on the film thickness include Ir, Ru, Rh, and Os and the like.

The first non-magnetic layer (31) may also contain other elements using these alloys as long as the crystal structure does not change. For example, such as Ta, B, Nb, and V may be exemplified.

The film thickness of the first non-magnetic layer (31) is desirably adjusted to 0.5±0.15 nm or 1.35±0.1 nm, which shows peak positions of antiferromagnetic coupling strength, when Ir is contained as the main element.

The film thickness of the first non-magnetic layer (31) is desirably adjusted to 0.9±0.2 nm or 0.4±0.15 nm, which shows peak positions of antiferromagnetic coupling strength, when Ru is contained as the main element.

Details of the first magnetic layer (21) of the second fixing layer (P2), the first Pt layer (41), and the second magnetic layer (22) are the same as those in Embodiment 1.

The second barrier layer (B2) is a tunnel barrier layer which is disposed on the side opposite to the first adjustment layer (A1) of the second fixing layer (P2) and composed of an insulation layer, and forms a magnetic tunnel junction together with the second fixing layer (P2) and the first recording layer (F1) to be described below. An insulator such as MgO, $Al_2O_3$, $SiO_2$, TiO, $Hf_2O$, or ScC is used and MgO or ScC is preferably used so that a large magnetoresistance change rate is exhibited by combining materials on two end surfaces.

In order to increase the TMR ratio, the film thickness of the second barrier layer (B2) is preferably 0.5 nm or more and more preferably 0.8 nm or more. In addition, in order to reverse the magnetization with a small write current $I_C$, the film thickness is preferably 2.0 nm or less and more preferably 1.2 nm or less. Therefore, the film thickness is adjusted to be within a range of 0.5 nm to 2.0 nm and more preferably within a range of 0.8 nm to 1.2 nm.

The recording layer (F1) is disposed adjacent to the second barrier layer (B2) on the side opposite to the second fixing layer (P2), and the magnetization direction is a direction perpendicular to a film surface.

The recording layer (F1) contains at least one of Co, Fe, and Ni.

In addition, the recording layer (F1) may further contain non-magnetic elements such as W, Ta, Hf, Zr, Nb, Mo, Ti, V, Cr, Si, Al, B, Pd, and Pt.

Specific examples include such as Co, Fe, Ni, CoFe, FeNi, CoNi, CoB, FeB, NiB, and CoFeB, and CoFeB and FeB are more preferable. In addition, the recording layer (F1) may be a Co/Pt multilayer film.

Here, the recording layer (F1) desirably has perpendicular magnetic anisotropy due to interface magnetic anisotropy with the second barrier layer (B2). In addition, for the first recording layer (F1), one or more non-magnetic insertion layers such as W, Ta, and Mo may be inserted, a layer such as MgO may be inserted to increase the interface, and the perpendicular magnetic anisotropy may be further improved.

The cap layer (C1) is a layer which is provided on the side opposite to the second barrier layer (B2) of the second fixing layer (P2) and includes an upper electrode, and electrically connects the second fixing layer (P2) of the magnetoresistance effect element to a bit line of a select transistor.

In addition, in the cap layer (C1), in addition to the upper electrode, a non-magnetic layer or the like required for improving characteristics of the magnetoresistance effect element can be appropriately formed between the upper electrode and the second fixing layer (P2).

The lower electrode (E1) is disposed on the side opposite to the second barrier layer (B2) of the second fixing layer (P2). The lower electrode (E1) is electrically connected to a select transistor (not shown), and the magnetoresistance effect element receives a current supply from the select transistor to write and read.

Figure 16:
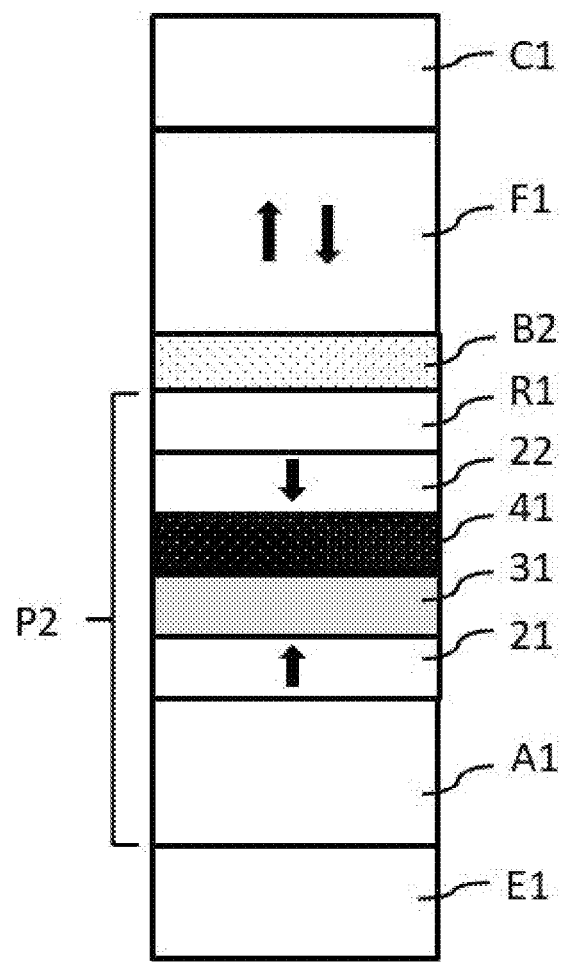
FIG. 16 is a longitudinal cross-sectional view of an example of a magnetoresistance effect element of the present invention.
Figure 18:
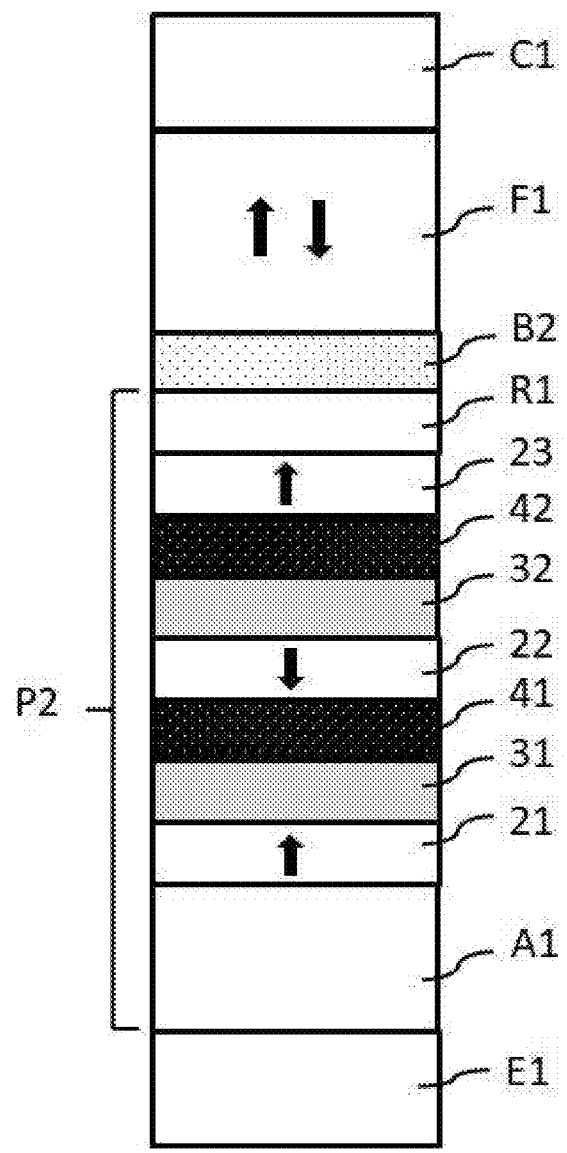
FIG. 18 is a longitudinal cross-sectional view of an example of a magnetoresistance effect element of the present invention.
Figure 20A:
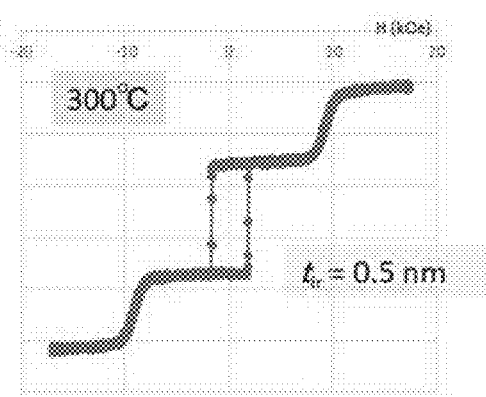
FIG. 20A to FIG. 20D show the evaluation results of heat resistance of a magnetoresistance effect element having a bottom-pinned structure.
Figure 20C:
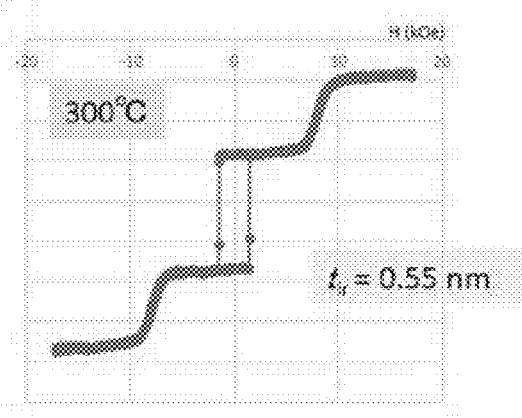
Figure 20B:
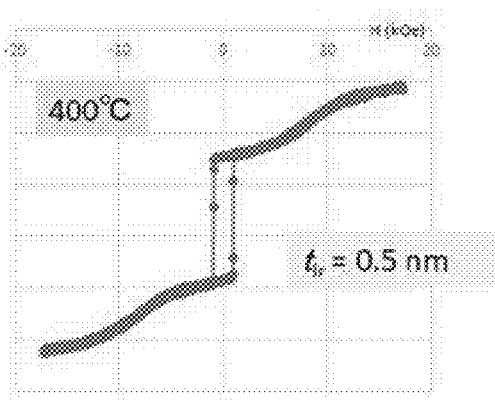
Figure 20D:
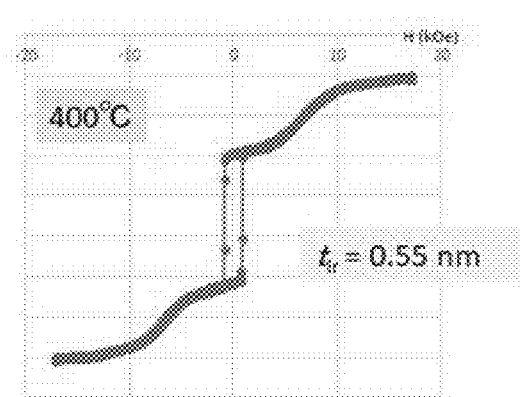

Here, in Embodiment 2, as shown in FIG. 16 and FIG. 18, the first reference layer (R1) may be provided on the side of the second barrier layer (B2) opposite to the recording layer (F1). Details of the first reference layer (R1) are the same as those in Embodiment 1.

Figure 17:
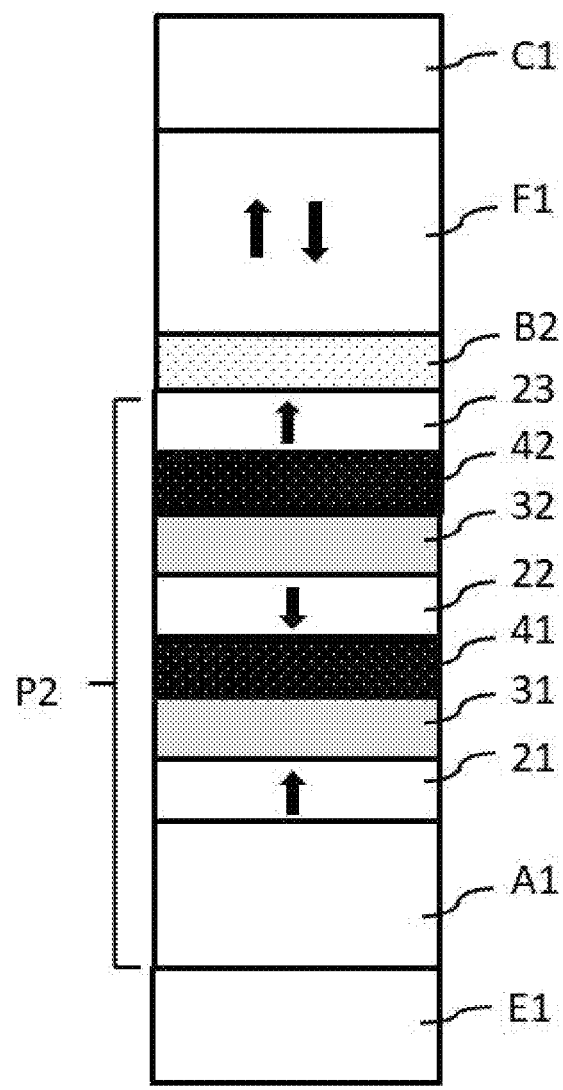
FIG. 17 is a longitudinal cross-sectional view of an example of a magnetoresistance effect element of the present invention.

In addition, in Embodiment 2, as shown in FIG. 17 and FIG. 18, one set or two or more sets of the non-magnetic layer/Pt layer/magnetic layer may be additionally disposed adjacent to the second magnetic layer (22) on the side opposite to the first Pt layer (41). An antiferromagnetic coupling is formed between the first magnetic layer (21) and the second magnetic layer (22) and between the second magnetic layer (22) and the third magnetic layer (23).

Features of Embodiment 2 will be described.

Also, in Embodiment 2, the crystal orientation of the magnetic layer is improved by inserting the Pt layer under the magnetic layer, which is between the magnetic layers forming an antiferromagnetic coupling, and even after the annealing treatment at 300° C. to 400° C., the perpendicular magnetic anisotropy and the antiferromagnetic coupling are maintained Hereinafter, the evaluation results of Embodiment 2 will be described.

Evaluation Test 5

The perpendicular magnetic anisotropy of the magnetoresistance effect element of Embodiment 2 was evaluated.

FIG. 19 shows the layer configuration used for evaluation. The configuration was Ta(5)/Pt(3)/Co(0.9)/Ir($t_{Ir}$)/Pt(0.6)/Co(0.9)/Ir($t_{Ir}$)/Pt(0.6)/Co(0.9)/Ir($t_{Ir}$)/Ta(5), and the number in parentheses indicates the film thickness (nm).

Since the Ir film has a film thickness of 0.53 nm and allows upper and lower magnetic layers to be effectively antiferromagnetically coupling, an evaluation film having an Ir film thickness $t_{Ir}$ of 0.5 nm and 0.55 nm was prepared and annealed at 300° C. and 400° C. for 1 hour.

FIG. 20A to FIG. 20D show an M-H curve (magnetization curve) when an external magnetic field was applied in the direction perpendicular to a film surface. Accordingly, it was confirmed that, regardless of whether the Ir film thickness was 0.5 nm or 0.55 nm, or the annealing treatment temperature was 300° C. or 400° C., the magnetic layer exhibited the perpendicular magnetic anisotropy, and Cos between the magnetic layers were antiferromagnetically coupled.

Embodiment 3

Figure 21:
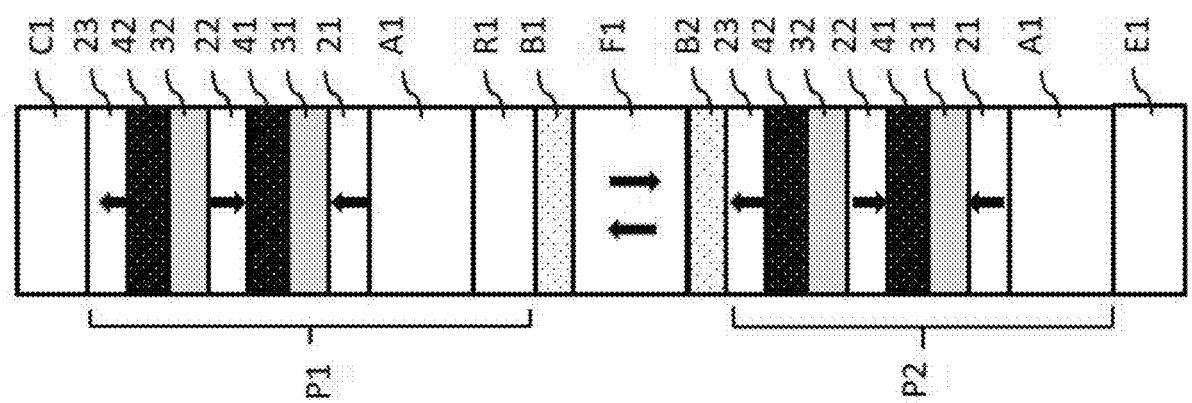
FIG. 21 is a longitudinal cross-sectional view of an example of a magnetoresistance effect element of the present invention.

FIG. 21 shows a basic configuration of Embodiment 3 of the present invention. In the basic configuration of the magnetoresistance effect element, the lower electrode (E1)/the first adjustment layer (A1)/the first magnetic layer (21)/the first non-magnetic layer (31)/the first Pt layer (41)/the second magnetic layer (22)/a second non-magnetic layer (32)/a second Pt layer (42)/the third magnetic layer (23)/the second barrier layer (B2)/the recording layer (F1)/the first barrier layer (B1)/the first reference layer (R1)/the first adjustment layer (A1)/the first magnetic layer (21)/the first non-magnetic layer (31)/the first Pt layer (41)/the second magnetic layer (22)/the second non-magnetic layer (32)/the second Pt layer (42)/the third magnetic layer (23)/the cap layer (C1) are disposed adjacent to each other in this order. The first reference layer (R1)/the first adjustment layer (A1)/the first magnetic layer (21)/the first non-magnetic layer (31)/the first Pt layer (41)/the second magnetic layer (22)/the second non-magnetic layer (32)/the second Pt layer (42)/the third magnetic layer (23) above the recording layer (F1) form the first fixing layer (P1). The first adjustment layer (A1)/the first magnetic layer (21)/the first non-magnetic layer (31)/the first Pt layer (41)/the second magnetic layer (22)/the second non-magnetic layer (32)/the second Pt layer (42)/the third magnetic layer (23) below the recording layer (F1) form the second fixing layer (P2).

That is, with the first barrier layer (B1), the recording layer (F1) and the second barrier layer (B2) therebetween, the first fixing layer (P1) is disposed on the side of the first barrier layer (B1), and two fixing layers of the second fixing layer (P2) are disposed on the side of the second barrier layer (B2).

Here, in Embodiment 3, a case in which two fixing layers having an antiferromagnetic coupling configuration in which a non-magnetic layer/Pt layer/magnetic layer is repeated twice are disposed is shown, but a configuration in which one, three, four, or five or more non-magnetic layers are inserted may be used. In addition, the numbers of non-magnetic layers in the first fixing layer (P1) and the second fixing layer (P2) may be different, and only one of the fixing layers between the first fixing layer (P1) and the second fixing layer (P2) may have a configuration of the non-magnetic layer/Pt layer/magnetic layer.

Embodiment 4

Figure 22:
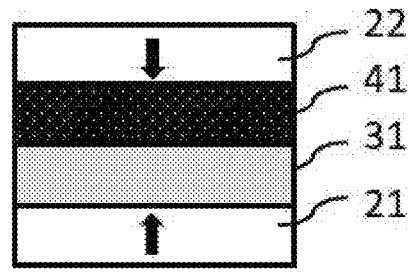
FIG. 22 is a longitudinal cross-sectional view of an example of a magnetic film of the present invention.

Embodiment 4 has a configuration of a magnetic film included in Embodiments 1 and 2. As shown in FIG. 22, the first magnetic layer (21)/the first non-magnetic layer (31)/the first Pt layer (41)/the second magnetic layer (22) are disposed adjacent to each other in this order.

The magnetization directions of the first magnetic layer (21) and the second magnetic layer (22) are both a direction perpendicular to a film surface, and an antiferromagnetic coupling is formed between the first magnetic layer (21) and the second magnetic layer (22).

In the first non-magnetic layer (31), the magnetic layers are antiferromagnetically coupled by the element film constituting the non-magnetic layer, and the interlayer exchange coupling energy between the magnetic layers, that is, the magnitude of antiferromagnetic coupling, is adjusted by the constituent elements and their film thickness. Examples of materials whose interlayer exchange coupling energy changes depending on the film thickness include Ir, Ru, Rh, and Os and the like.

The first non-magnetic layer (31) may also contain other elements using these alloys as long as the crystal structure does not change. For example, Ta, B, Nb, and V and the like may be exemplified.

The film thickness of the first non-magnetic layer (31) is desirably adjusted to 0.5±0.15 nm or 1.35±0.1 nm, which shows peak positions of antiferromagnetic coupling strength, when Ir is contained as the main element.

The film thickness of the first non-magnetic layer (31) is desirably adjusted to 0.9±0.2 nm or 0.4±0.15 nm, which shows peak positions of antiferromagnetic coupling strength, when Ru is contained as the main element.

Details of the first magnetic layer (21), the first Pt layer (41), and the second magnetic layer (22) are the same as those in Embodiment 1.

Figure 23:
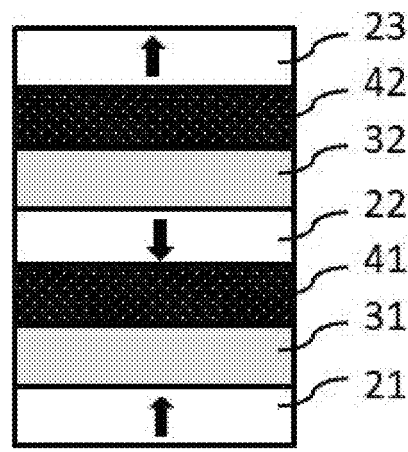
FIG. 23 is a longitudinal cross-sectional view of an example of a magnetic film of the present invention.
Figure 24:
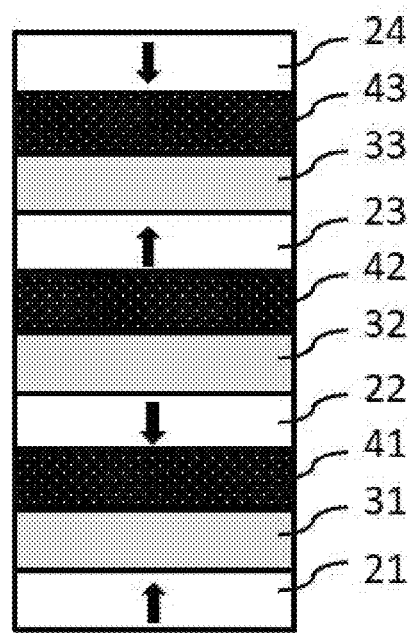
FIG. 24 is a longitudinal cross-sectional view of an example of a magnetic film of the present invention.

In addition, in Embodiment 4, as shown in FIG. 23 and FIG. 24, one set or two or more sets of the non-magnetic layer/Pt layer/magnetic layer may be additionally disposed adjacent to the second magnetic layer (22) on the side opposite to the first Pt layer (41). An antiferromagnetic coupling is formed between the magnetic layers.

As described above, Embodiment 4 has features of the invention shown in Embodiment 1 and Embodiment 2, and due to the layer configuration of the first magnetic layer (21)/the first non-magnetic layer (31)/the first Pt layer (41)/the second magnetic layer (22), since crystal orientation of the second magnetic layer (22) can be improved, the perpendicular magnetic anisotropy and antiferromagnetic coupling between the first magnetic layer (21) and the second magnetic layer (22) can be maintained even in the annealing treatment at 400° C.

Embodiment 5

Embodiment 5 has a configuration of the magnetic layer included in Embodiments 1 and 2, and in Embodiment 4, the first adjustment layer (A1) is additionally disposed. As shown in FIG. 25, the first adjustment layer (A1)/the first magnetic layer (21)/the first non-magnetic layer (31)/the first Pt layer (41)/the second magnetic layer (22) are disposed adjacent to each other in this order.

The magnetization directions of the first magnetic layer (21) and the second magnetic layer (22) are both a direction perpendicular to a film surface, and an antiferromagnetic coupling is formed between the first magnetic layer (21) and the second magnetic layer (22).

In the first non-magnetic layer (31), the magnetic layers are antiferromagnetically coupled by the element film constituting the non-magnetic layer, and the interlayer exchange coupling energy between the magnetic layers, that is, the magnitude of antiferromagnetic coupling, is adjusted by the constituent elements and their film thickness. Examples of materials whose interlayer exchange coupling energy changes depending on the film thickness include Ir, Ru, Rh, and Os and the like.

The first non-magnetic layer (31) may also contain other elements using these alloys as long as the crystal structure does not change. For example, Ta, B, Nb, and V and the like may be exemplified.

The film thickness of the first non-magnetic layer (31) is desirably adjusted to 0.5±0.15 nm or 1.35±0.1 nm, which shows peak positions of antiferromagnetic coupling strength, when Ir is contained as the main element.

The film thickness of the first non-magnetic layer (31) is desirably adjusted to 0.9±0.2 nm or 0.4±0.15 nm, which shows peak positions of antiferromagnetic coupling strength, when Ru is contained as the main element.

Details of the first magnetic layer (21), the first Pt layer (41), and the second magnetic layer (22) are the same as those in Embodiment 1.

The first adjustment layer (A1) contains Pt, and a Pt layer, and a Co/Pt multilayer film containing Pt as a main element may be exemplified. In addition, it may contain other elements as long as properties of the crystal structure and/or layers do not change.

Figure 27:
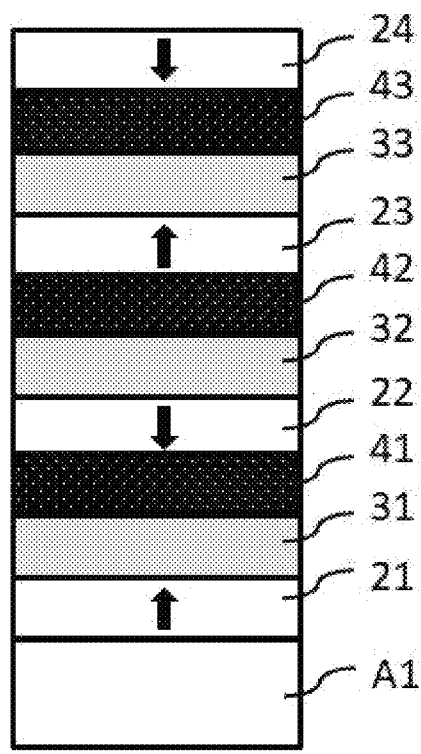
FIG. 27 is a longitudinal cross-sectional view of an example of a magnetic film of the present invention.

Here, in Embodiment 5, as shown in FIG. 26 and FIG. 27, one or more sets of the non-magnetic layer/Pt layer/magnetic layer may be additionally disposed adjacent to the second magnetic layer (22) on the side opposite to the first Pt layer (41). An antiferromagnetic coupling is formed between the magnetic layers.

In Embodiment 5, since the first adjustment layer (A1) is additionally provided in Embodiment 4, in addition to the effects shown in Embodiment 4, the crystal orientation of the magnetic layer (particularly, the first magnetic layer) in the fixing layer can be additionally improved and the magnetic characteristics are improved.

In the following Embodiments 6-10, more specific examples will be described.

Embodiment 6

Figure 28:
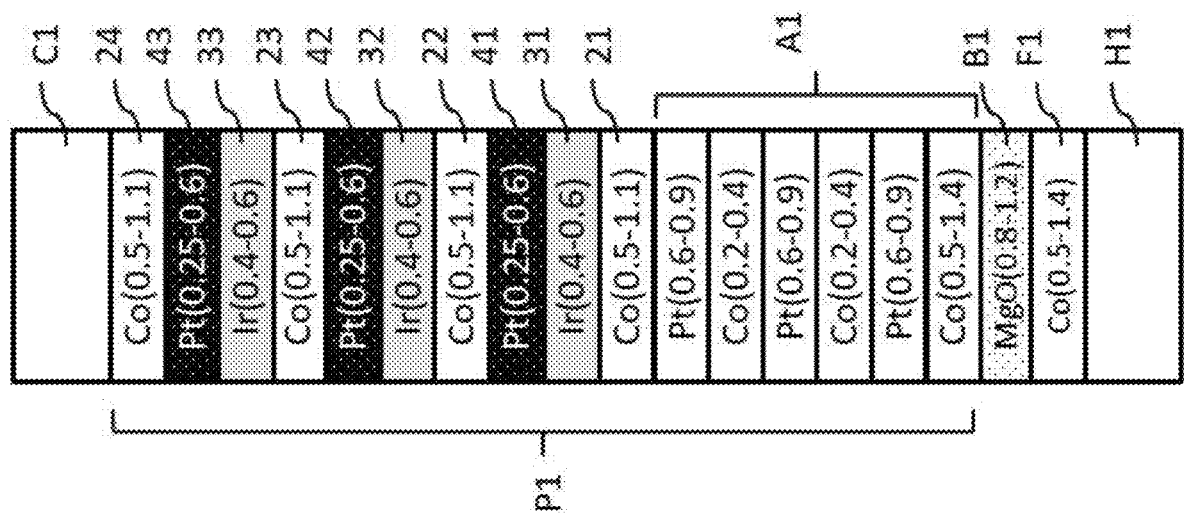
FIG. 28 is a longitudinal cross-sectional view of an example of a magnetoresistance effect element of the present invention.

FIG. 28 shows a more specific configuration of Embodiment 6 of the top-pinned structure of the present invention. In the configuration of the magnetoresistance effect element, the heavy metal layer (H1)/Co(0.5-1.4)/MgO(0.8-1.2)/Co(0.5-1.4)/Pt(0.6-0.9)/Co(0.2-0.4)/Pt(0.6-0.9)/Co(0.2-0.4)/Pt(0.6-0.9)/Co(0.5-1.1)(21)/Ir(0.4-0.6)(31)/Pt(0.25-0.6)(41)/Co(0.5-1.1)(22)/Ir(0.4-0.6)(32)/Pt(0.25-0.6)(42)/Co(0.5-1.1)(23)/Ir(0.4-0.6)(33)/Pt(0.25-0.6)(43)/Co(0.5-1.1)(24) are disposed in this order. The numerical value range in parentheses indicates the range of film thickness (nm).

Here, 21, 22, 23, and 24 correspond to the first magnetic layer, the second magnetic layer, the third magnetic layer, and the fourth magnetic layer. In addition, 31, 32, and 33 correspond to the first non-magnetic layer, the second non-magnetic layer, and the third non-magnetic layer. In addition, 41, 42, and 43 correspond to the first Pt layer, the second Pt layer, and the third Pt layer.

Here, in the layer configuration of Embodiment 6, the fact that the crystal orientation and perpendicular magnetic anisotropy of the magnetic layer in the fixing layer are maintained can be evaluated in the evaluation test described above. That is, the crystal orientation was confirmed by the fact that, in the X-ray diffraction spectrum, a main peak of an X-ray diffraction intensity was shown when the angle 2θ, which is twice an angle of X-ray incidence, was 42° or more and 43° or less, and the states of the perpendicular magnetic anisotropy and antiferromagnetic coupling were confirmed by the fact that, in the magnetization curve of the evaluation film, a substantially vertical loop was obtained when $\mu_0 H$ was near zero.

The inventors have found that, in the examination of the layer configuration, in order to particularly maintain the crystal orientation, focusing on, for example, a ratio of Co and Pt, a peak in the X-ray diffraction spectrum was shown between 42° or more and 43° or less.

In addition, in the layer configuration of Embodiment 6, some or all of the magnetic layers (the first magnetic layer, the second magnetic layer, the third magnetic layer, and the fourth magnetic layer) to be antiferromagnetically coupled are made into multiple layers, and the film thickness of each layer including the Pt layer inserted under the magnetic layer can be made thin. As in the following examples, the first Pt layer, the second Pt layer, and the third Pt layer (Pt(0.25-0.6)) in FIG. 28 can be Pt(0.2-0.4), and the second magnetic layer, the third magnetic layer, and the fourth magnetic layer (Co(0.5-1.1)) can be Co(0.4-0.6)/Pt(0.2-0.4)/Co(0.4-0.6) or the like.

Co(0.5-1.4)/MgO(0.8-1.2)/Co(0.5-1.4)/Pt(0.6-0.9)/Co(0.2-0.4)/Pt(0.6-0.9)/Co(0.2-0.4)/Pt(0.6-0.9)/Co(0.5-1.1)/Ir(0.4-0.6)/Pt(0.2-0.4)/Co(0.4-0.6)/Pt(0.2-0.4)/Co(0.4-0.6)/Ir(0.4-0.6)/Pt(0.2-0.4)/Co(0.4-0.6)/Pt(0.2-0.4)/Co(0.4-0.6)/Ir(0.4-0.6)/Pt(0.2-0.4)/Co(0.4-0.6)/Pt(0.2-0.4)/Co(0.4-0.6)

Embodiment 7

Figure 29:
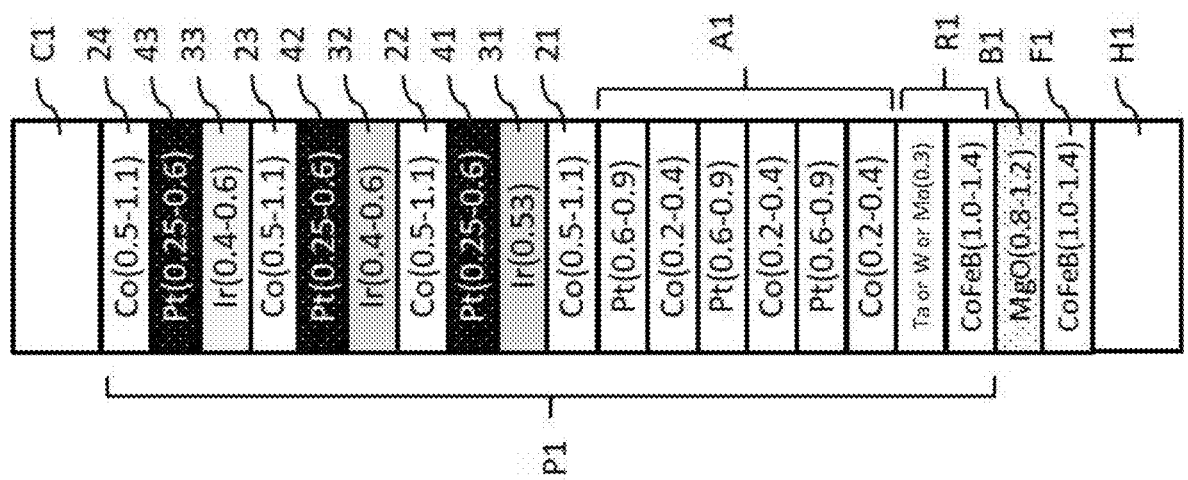
FIG. 29 is a longitudinal cross-sectional view of an example of a magnetoresistance effect element of the present invention.

FIG. 29 shows a more specific configuration of Embodiment 7 of the top-pinned structure of the present invention. In the configuration of the magnetoresistance effect element, the heavy metal layer (H1)/CoFeB(1.0-1.4)/MgO(0.8-1.2)/CoFeB(1.0-1.4)/Ta or W or Mo(0.3)/Co(0.2-0.4)/Pt(0.6-0.9)/Co(0.2-0.4)/Pt(0.6-0.9)/Co(0.2-0.4)/Pt(0.6-0.9)/Co(0.5-1.1)(21)/Ir(0.53)(31)/Pt(0.25-0.6)(41)/Co(0.5-1.1)(22)/Ir(0.4-0.6)(32)/Pt(0.25-0.6)(42)/Co(0.5-1.1)(23)/Ir(0.4-0.6)(33)/Pt(0.25-0.6)(43)/Co(0.5-1.1)(24)/the cap layer (C1) are disposed in this order. The numerical value range in parentheses indicates the range of film thickness (nm).

Here, 21, 22, 23, and 24 correspond to the first magnetic layer, the second magnetic layer, the third magnetic layer, and the fourth magnetic layer. In addition, 31, 32, and 33 correspond to the first non-magnetic layer, the second non-magnetic layer, and the third non-magnetic layer. In addition, 41, 42, and 43 correspond to the first Pt layer, the second Pt layer, and the third Pt layer.

In the configuration of Embodiment 7, the first reference layer (R1) is disposed on the side of the first barrier layer (B1) of the first fixing layer (P1).

Here, as in Embodiment 6, in the configuration of Embodiment 7, some or all of the magnetic layers (the first magnetic layer, the second magnetic layer, the third magnetic layer, and the fourth magnetic layer) to be antiferromagnetically coupled are made into multiple layers, and the film thickness of each layer including the Pt layer inserted under the magnetic layer can be made thin. As in the following examples, the first Pt layer, the second Pt layer, and the third Pt layer (Pt(0.25-0.6)) in FIG. 29 can be Pt(0.2-0.4), and the second magnetic layer, the third magnetic layer, and the fourth magnetic layer (Co(0.5-1.1)) can be Co(0.4-0.6)/Pt(0.2-0.4)/Co(0.4-0.6) or the like. CoFeB(1.0-1.4)/MgO(0.8-1.2)/CoFeB(1.0-1.4)/Ta or W or Mo(0.3)/Co(0.2-0.4)/Pt(0.6-0.9)/Co(0.2-0.4)/Pt(0.6-0.9)/Co (0.2-0.4)/Pt(0.6-0.9)/Co(0.5-1.1)/Ir(0.53)/Pt(0.2-0.4)/Co (0.4-0.6)/Pt(0.2-0.4)/Co(0.4-0.6)/Ir(0.4-0.6)/Pt(0.2-0.4)/Co (0.4-0.6)/Pt(0.2-0.4)/Co(0.4-0.6)/Ir(0.4-0.6)/Pt(0.2-0.4)/Co (0.4-0.6)/Pt(0.2-0.4)/Co(0.4-0.6)

Embodiment 8

Figure 30:
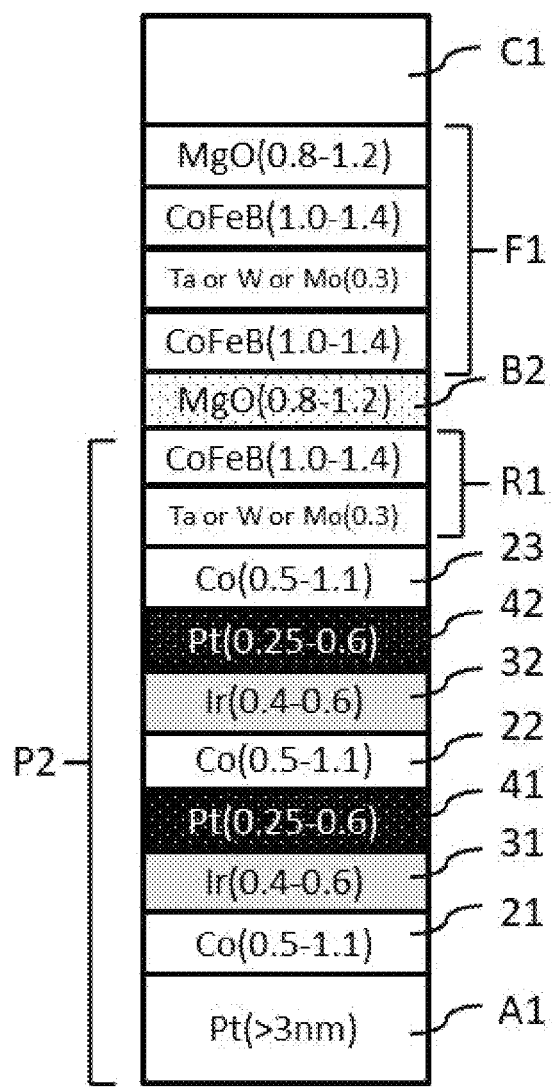
FIG. 30 is a longitudinal cross-sectional view of an example of a magnetoresistance effect element of the present invention.

FIG. 30 shows a more specific configuration of Embodiment 8 of the bottom-pinned structure of the present invention. In the configuration of the magnetoresistance effect element, Pt(>3)/Co(0.5-1.1)(21)/Ir(0.4-0.6)(31)/Pt(0.25-0.6)(41)/Co(0.5-1.1)(22)/Ir(0.4-0.6)(32)/Pt(0.25-0.6)(42)/Co(0.5-1.1)(23)/Ta or W or Mo(0.3)/CoFeB(1.0-1.4)/MgO (0.8-1.2)/CoFeB(1.0-1.4)/Ta or W or Mo(0.3)/CoFeB(1.0-1.4)/MgO(0.8-1.2) are disposed in this order. The numerical value range in parentheses indicates the range of film thickness (nm).

Here, 21, 22, and 23 correspond to the first magnetic layer, the second magnetic layer, and the third magnetic layer. In addition, 31 and 32 correspond to the first non-magnetic layer and the second non-magnetic layer. In addition, 41 and 42 correspond to the first Pt layer and the second Pt layer.

In Embodiment 8, in addition to the configuration of the non-magnetic layer/Pt layer/magnetic layer, the first reference layer (R1) is disposed on the side of the second barrier layer (B2) of the second fixing layer (P2), and the second barrier layer (B2) is MgO.

As in Embodiment 6, in the layer configuration of Embodiment 8, some or all of the magnetic layers (the first magnetic layer, the second magnetic layer, and the third magnetic layer) to be antiferromagnetically coupled are made into multiple layers, the film thickness of each layer including the Pt layer inserted under the magnetic layer can be made thin. As in the following examples, the first Pt layer and the second Pt layer (Pt(0.25-0.6)) in FIG. 30 can be Pt(0.2-0.4), and the second magnetic layer and the third magnetic layer (Co(0.5-1.1)) can be Co(0.4-0.6) or the like. Pt(>3)/Co(0.4-0.6)/Ir(0.4-0.6)/Pt(0.2-0.4)/Co(0.4-0.6)/Ir (0.4-0.6)/Pt(0.2-0.4)/Co(0.4-0.6)/Ta or W or Mo(0.3)/ CoFeB(1.0-1.4)/MgO(0.8-1.2)/CoFeB(1.0-1.4)/Ta or W or Mo(0.3)/CoFeB(1.0-1.4)/MgO(0.8-1.2)

Here, as will be described below, the first Pt layer and the second Pt layer (Pt(0.25-0.6)) in FIG. 30 can be Pt(0.1-0.2), and the second magnetic layer and the third magnetic layer (Co(0.5-1.1)) can be Co(0.2-0.3)/Pt(0.1-0.2)/Co(0.2-0.3) or the like.
Pt(>3)/Co(0.4-0.6)/Ir(0.4-0.6)/Pt(0.1-0.2)/Co(0.2-0.3)/Pt (0.1-0.2)/Co(0.2-0.3)/Ir(0.4-0.6)/Pt(0.1-0.2)/Co(0.2-0.3)/Pt (0.1-0.2)/Co(0.2-0.3)/Ta or W or Mo(0.3)/CoFeB(1.0-1.4)/ MgO(0.8-1.2)/CoFeB(1.0-1.4)/Ta or W or Mo(0.3)/CoFeB (1.0-1.4)/MgO(0.8-1.2)

Embodiment 9

Figure 31:
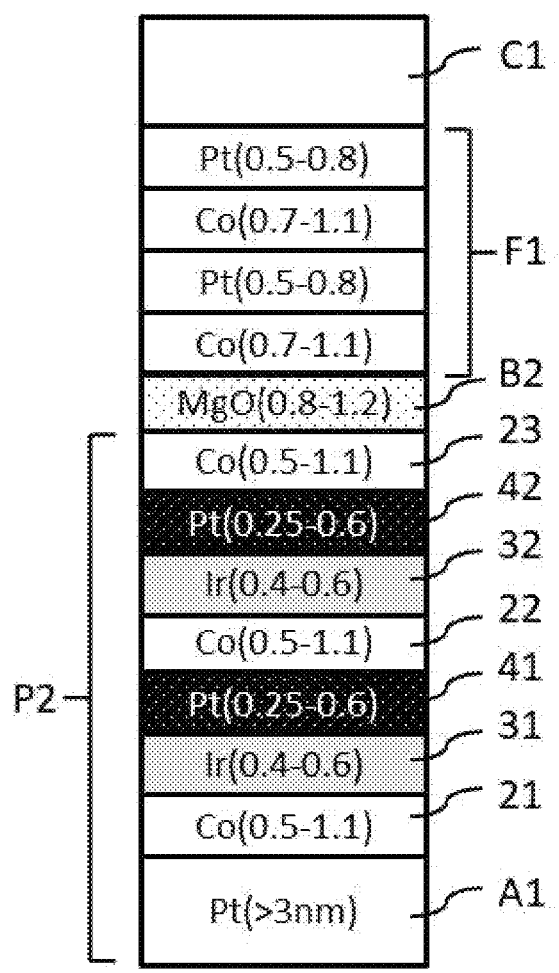
FIG. 31 is a longitudinal cross-sectional view of an example of a magnetoresistance effect element of the present invention.

FIG. 31 shows a more specific configuration of Embodiment 9 of the bottom-pinned structure of the present invention. In the configuration of the magnetoresistance effect element, Pt(>3)/Co(0.5-1.1)(21)/Ir(0.4-0.6)(31)/Pt(0.25-0.6)(41)/Co(0.5-1.1)(22)/Ir(0.4-0.6)(32)/Pt(0.25-0.6)(42)/Co(0.5-1.1)(23)/MgO(0.8-1.2)/Co(0.7-1.1)/Pt(0.5-0.8)/Co (0.7-1.1)/Pt(0.5-0.8) are disposed in this order. The numerical value range in parentheses indicates the range of film thickness (nm).

Here, 21, 22, and 23 correspond to the first magnetic layer, the second magnetic layer, and the third magnetic layer. In addition, 31 and 32 correspond to the first non-magnetic layer and the second non-magnetic layer. In addition, 41 and 42 correspond to the first Pt layer and the second Pt layer.

As in Embodiment 6, in the layer configuration of Embodiment 9, some or all of the magnetic layers (the first magnetic layer, the second magnetic layer, and the third magnetic layer) to be antiferromagnetically coupled are made into multiple layers, the film thickness of each layer including the Pt layer inserted under the magnetic layer can be made thin. As in the following examples, the first Pt layer and the second Pt layer (Pt(0.25-0.6)) in FIG. 30 can be Pt(0.2-0.4), and the second magnetic layer and the third magnetic layer (Co(0.5-1.1)) can be Co(0.4-0.6) or the like. Pt(>3)/Co(0.4-0.6)/Ir(0.4-0.6)/Pt(0.2-0.4)/Co(0.4-0.6)/Ir (0.4-0.6)/Pt(0.2-0.4)/Co(0.4-0.6)/MgO(0.8-1.2)/Co(0.7-1.1)/Pt(0.5-0.8)/Co(0.7-1.1)/Pt(0.5-0.8)

In addition, as will be described below, the first Pt layer and the second Pt layer (Pt(0.25-0.6)) in FIG. 31 can be Pt(0.1-0.2), and the second magnetic layer and the third magnetic layer (Co(0.5-1.1)) can be Co(0.2-0.3)/Pt(0.1-0.2)/Co(0.2-0.3) or the like.
Pt(>3)/Co(0.4-0.6)/Ir(0.4-0.6)/Pt(0.1-0.2)/Co(0.2-0.3)/Pt (0.1-0.2)/Co(0.2-0.3)/Ir(0.4-0.6)/Pt(0.1-0.2)/Co(0.2-0.3)/Pt (0.1-0.2)/Co(0.2-0.3)/MgO(0.8-1.2)/Co(0.7-1.1)/Pt(0.5-0.8)/Co(0.7-1.1)/Pt(0.5-0.8)

Embodiment 10

Figure 32:
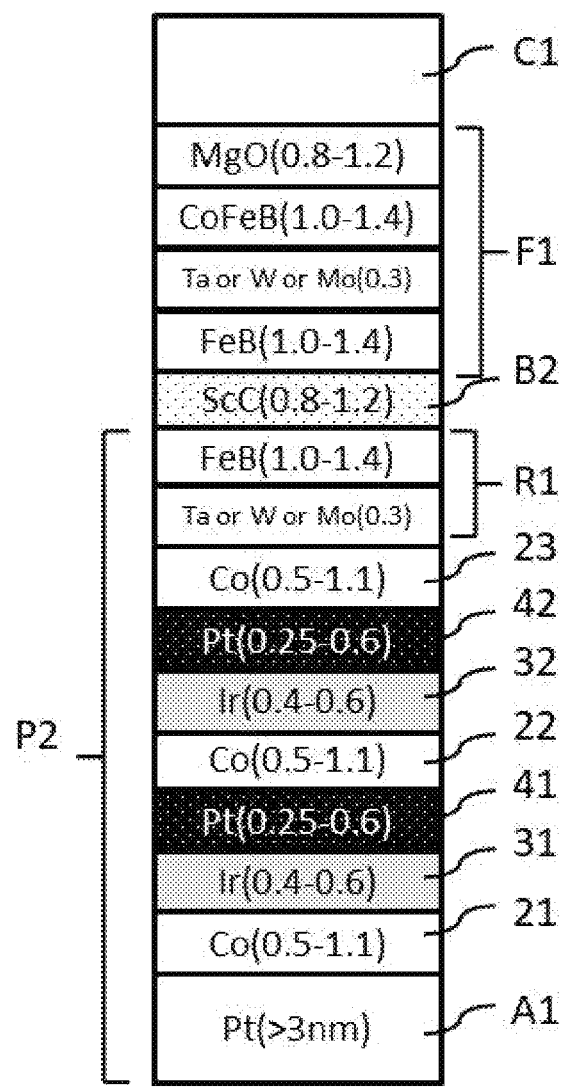
FIG. 32 is a longitudinal cross-sectional view of an example of a magnetoresistance effect element of the present invention.

FIG. 32 shows a more specific configuration of Embodiment 10 of the bottom-pinned structure of the present invention. In the configuration of the magnetoresistance effect element, Pt(>3)/Co(0.5-1.1)(21)/Ir(0.4-0.6)(31)/Pt (0.25-0.6)(41)/Co(0.5-1.1)(22)/Ir(0.4-0.6)(32)/Pt(0.25-0.6) (42)/Co(0.5-1.1)(23)/Ta or W or Mo(0.3)/FeB(1.0-1.4)/ScC (0.8-1.2)/FeB(1.0-1.4)/Ta or W or Mo(0.3)/CoFeB(1.0-1.4)/ MgO(0.8-1.2) are disposed in this order. The numerical value range in parentheses indicates the range of film thickness (nm).

Here, 21, 22, and 23 correspond to the first magnetic layer, the second magnetic layer, and the third magnetic layer. In addition, 31 and 32 correspond to the first non-magnetic layer and the second non-magnetic layer. In addition, 41 and 42 correspond to the first Pt layer and the second Pt layer.

In Embodiment 8, in addition to the configuration of the non-magnetic layer/Pt layer/magnetic layer, the first reference layer (R1) is disposed on the side of the second barrier layer (B2) of the second fixing layer (P2), and the second barrier layer (B2) is ScC.

As in Embodiment 6, in the layer configuration of Embodiment 10, some or all of the magnetic layers (the first magnetic layer, the second magnetic layer, and the third magnetic layer) to be antiferromagnetically coupled are made into multiple layers, the film thickness of each layer including the Pt layer inserted under the magnetic layer can be made thin. As in the following examples, the first Pt layer and the second Pt layer (Pt(0.25-0.6)) in FIG. 32 can be Pt(0.2-0.4), and the second magnetic layer and the third magnetic layer (Co(0.5-1.1)) can be Co(0.4-0.6) or the like.

Pt(>3)/Co(0.4-0.6)/Ir(0.4-0.6)/Pt(0.2-0.4)/Co(0.4-0.6)/Ir (0.4-0.6)/Pt(0.2-0.4)/Co(0.4-0.6)/Ta or W or Mo(0.3)/FeB (1.0-1.4)/ScC(0.8-1.2)/FeB(1.0-1.4)/Ta or W or Mo(0.3)/ CoFeB(1.0-1.4)/MgO(0.8-1.2)

In addition, as will be described below, the first Pt layer and the second Pt layer (Pt(0.25-0.6)) in FIG. 32 can be Pt(0.1-0.2), and the second magnetic layer and the third magnetic layer (Co(0.5-1.1)) can be Co(0.2-0.3)/Pt(0.1-0.2)/ Co(0.2-0.3) or the like.
Pt(>3)/Co(0.4-0.6)/Ir(0.4-0.6)/Pt(0.1-0.2)/Co(0.2-0.3)/Pt (0.1-0.2)/Co(0.2-0.3)/Ir(0.4-0.6)/Pt(0.1-0.2)/Co(0.2-0.3)Pt (0.1-0.2)/Co(0.2-0.3)/Ta or W or Mo(0.3)/FeB(1.0-1.4)/ScC (0.8-1.2)/FeB(1.0-1.4)/Ta or W or Mo(0.3)/CoFeB(1.0-1.4)/ MgO(0.8-1.2)

Embodiment 11

Figure 33:
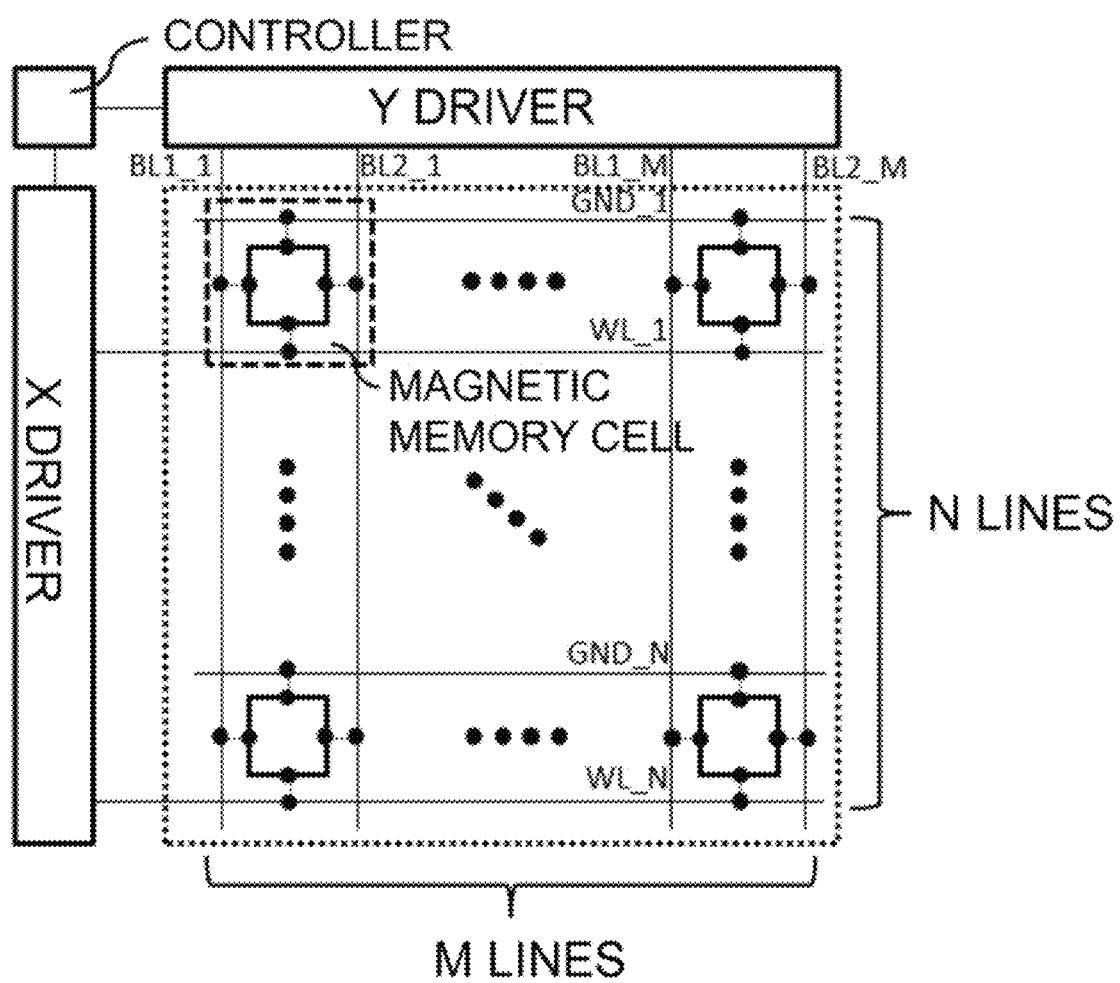
FIG. 33 shows an example of a magnetic memory of the present invention.

FIG. 33 shows an example of a magnetic memory including a plurality of magnetic memory cells.

The magnetic memory includes a memory cell array, an X driver, a Y driver, and a controller. The memory cell array has magnetic memory cells disposed in an array. The X driver is connected to a plurality of word lines WL, and the Y driver is connected to a plurality of bit lines BL, and functions as a reading unit and a writing unit.

Embodiment 12

Figure 36A:
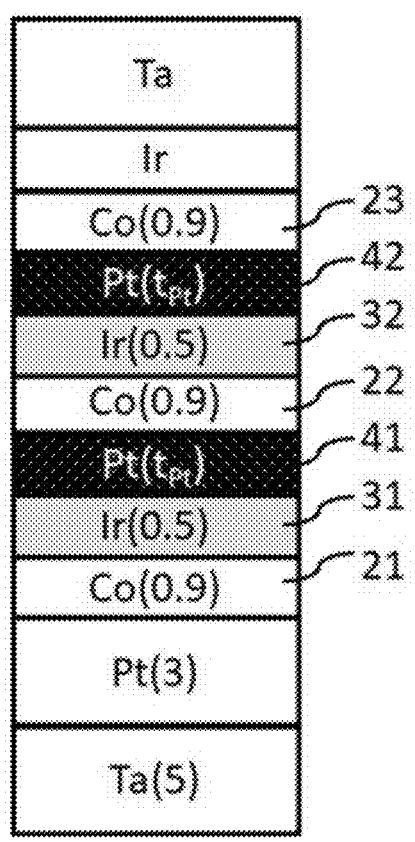
FIG. 36A and FIG. 36B show examples of a configuration of a film used for evaluating heat resistance of a magnetic film of the present invention.
Figure 36B:
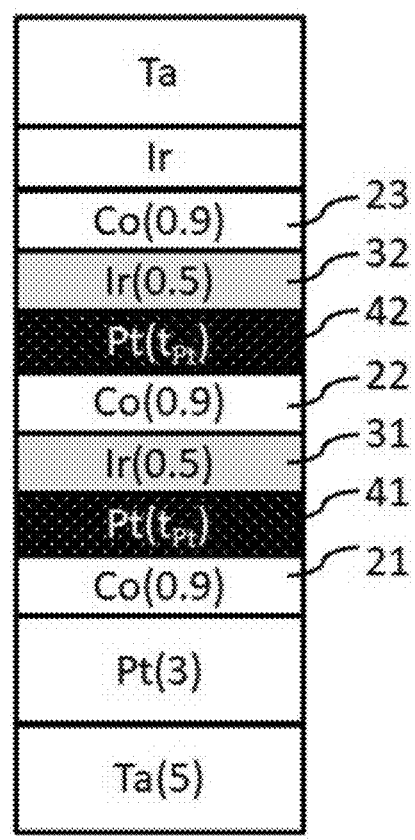

FIG. 36A and FIG. 36B show specific configurations of Embodiment 12 of the present invention.

In the configuration of FIG. 36A, Ta(5)/Pt(3)/Co(0.9)/Ir (0.5)/Pt($t_{Pt}$)/Co(0.9)/Ir(0.5)/Pt($t_{Pt}$)/Co(0.9)/Ir/Ta are disposed in that order, and the numerical value ranges in parentheses indicate the range of film thicknesses (nm). The configuration of FIG. 36A is designed to evaluate an example of the magnetic film of FIG. 23. That is, respective layers correspond to Co(first magnetic layer (21))/Ir (first non-magnetic layer (31))/Pt (first Pt layer (41))/Co(second magnetic layer (22))/Ir (second non-magnetic layer (32))/Pt (second Pt layer (42))/Co(third magnetic layer (23)).

On the other hand, in the configuration of FIG. 36B, Ta(5)/Pt(3)/Co(0.9)/Pt($t_{Pt}$)/Ir(0.5)/Co(0.9)/Pt($t_{Pt}$)/Ir(0.5)/Co (0.9)/Ir/Ta are disposed in that order, and the numerical value ranges in parentheses indicate the range of film thicknesses (nm). In the configuration of FIG. 36B, the Pt layer and the non-magnetic layer inserted between magnetic layers are disposed in reverse order to that in the magnetic film of FIG. 23. That is, respective layers correspond to Co(first magnetic layer (21))/Pt (first Pt layer (41))/Ir (first non-magnetic layer (31))/Co (second magnetic layer (22))/ Pt (second Pt layer (42))/Ir (second non-magnetic layer (32))/Co(third magnetic layer (23)).

Evaluation Test 1 of Embodiment 12

First, in FIG. 36A and FIG. 36B, an evaluation element having a Pt film thickness $t_{Pt}$ of 0.6 nm was prepared and annealed at 300° C. for 1 hour.

Figure 37A:
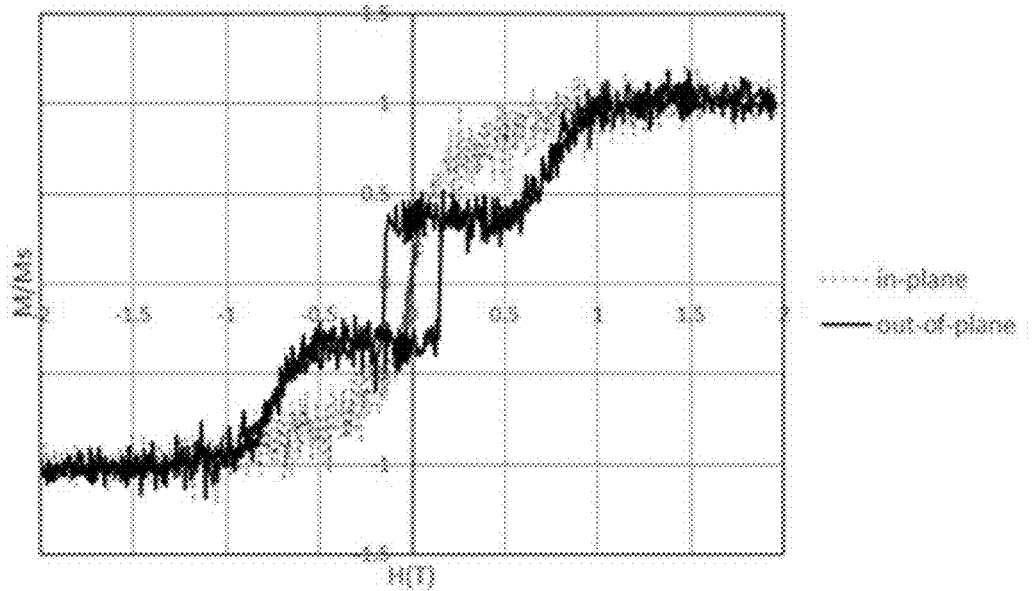
FIG. 37A and FIG. 37B show evaluation results of heat resistance of an example of a magnetic film of the present invention.
Figure 37B:
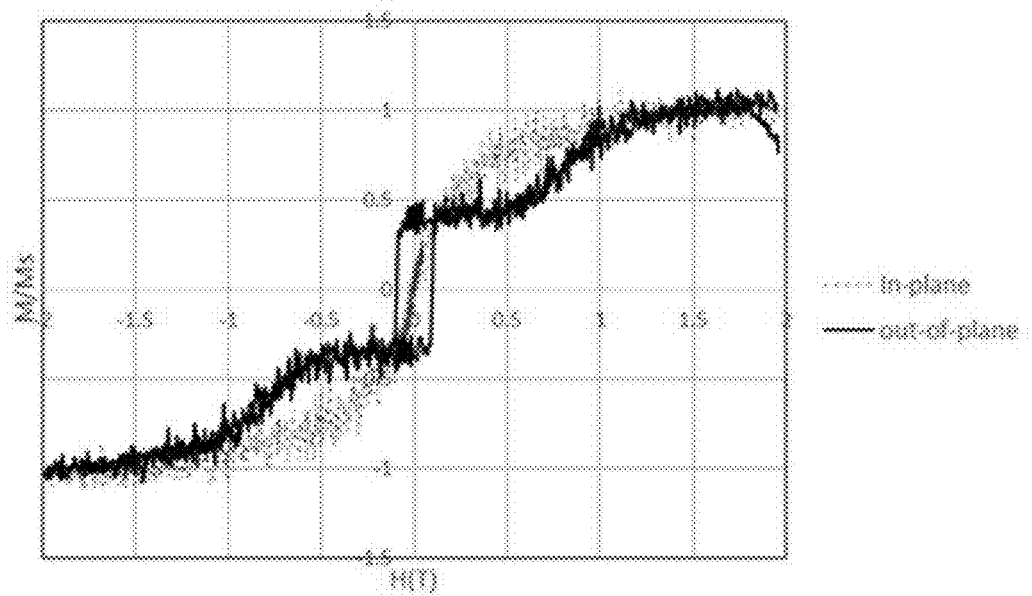

The magnetization curves obtained from the evaluation elements are shown in FIG. 37A and FIG. 37B. Here, the magnetization curve with a vertical axis representing M/Ms obtained by dividing the magnetization by the saturation magnetization and a horizontal axis representing the magnetic field H(T) was obtained by sweeping the magnetic field in the direction perpendicular to a film surface and in the in-plane direction.

In both the evaluation elements of FIG. 37A and FIG. 37B, in the magnetization curve (solid line) when the magnetic field was swept in the direction perpendicular to a film surface, a substantially vertical loop was obtained when H was near zero. Therefore, it was confirmed that the magnetic layer exhibited perpendicular magnetic anisotropy, and Co in the magnetic layers was favorably antiferromagnetically coupled.

In both the evaluation elements of FIG. 37A and FIG. 37B, in the magnetization curve (dotted line) when a magnetic field was applied in the plane, a substantially vertical loop was not obtained when the magnetic field H was zero.

Here, it could be understood that, even if annealing was performed at 400° C., Co in the magnetic layers was favorably antiferromagnetically coupled.

Based on the results of Evaluation Test 1 of Embodiment 12, it could be understood that, even if the order of the non-magnetic layer and the Pt layer laminated was reversed, perpendicular magnetic anisotropy was confirmed, and the magnetic layers were favorably antiferromagnetically coupled.

Evaluation Test 2 of Embodiment 12

Next, in the evaluation elements of FIG. 36A and FIG. 36B, an element was prepared by varying the Pt film thickness $t_{Pt}$ in a numerical value of 0 nm to 1.3 nm, and annealed at 300° C. for 1 hour.

Figure 38:
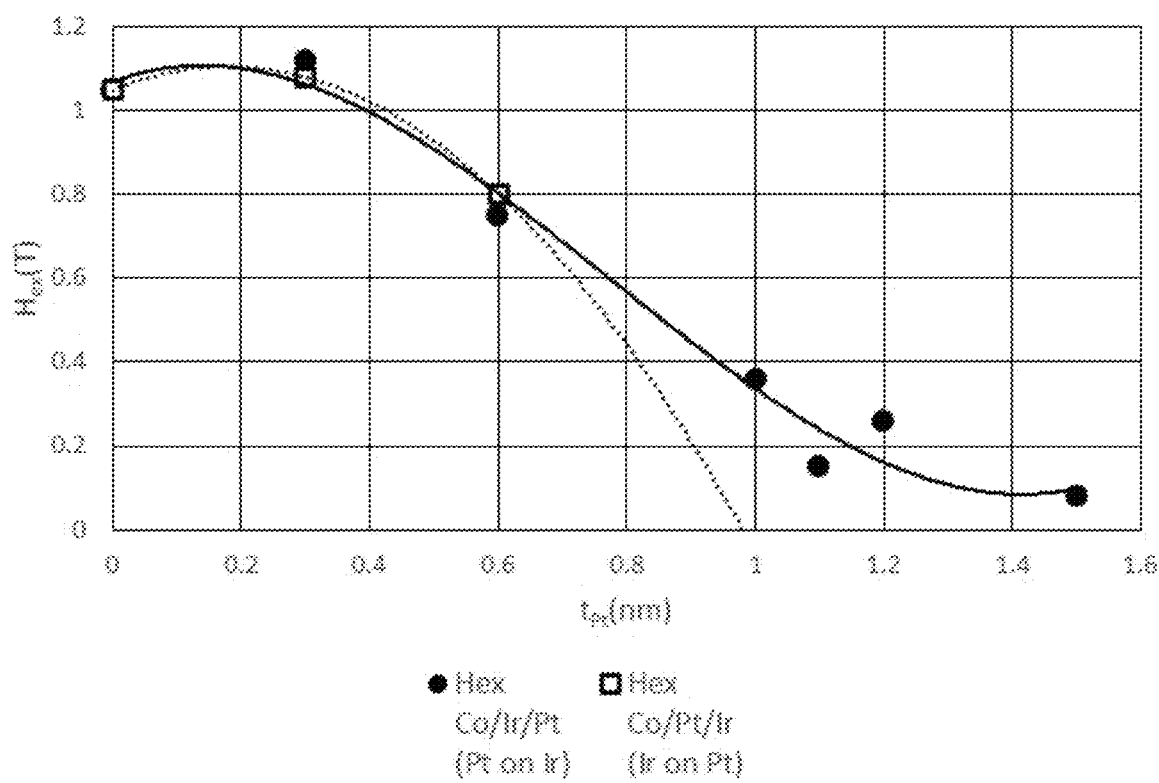
FIG. 38 shows evaluation results of heat resistance of an example of a magnetic film of the present invention.

The result obtained by measuring the external magnetic field Hex obtained in the evaluation element is shown in FIG. 38. The horizontal axis represents the film thickness of Pt, and the vertical axis represents the external magnetic field Hex.

In FIG. 38, it could be understood that, when the Pt film thickness was 0.7 nm or less, and particularly 0.4 nm or less, favorable characteristics with a strong external magnetic field Hex were obtained.

Here, it could be understood that, even if annealing was performed at 400° C., Co in the magnetic layers was favorably antiferromagnetically coupled.

Based on the results of Evaluation Test 2 of Embodiment 12, it could be understood that, even if Pt was inserted into antiferromagnetically coupled Co—Ir—Co, it was possible to maintain a strong external magnetic field.

Figure 39A:
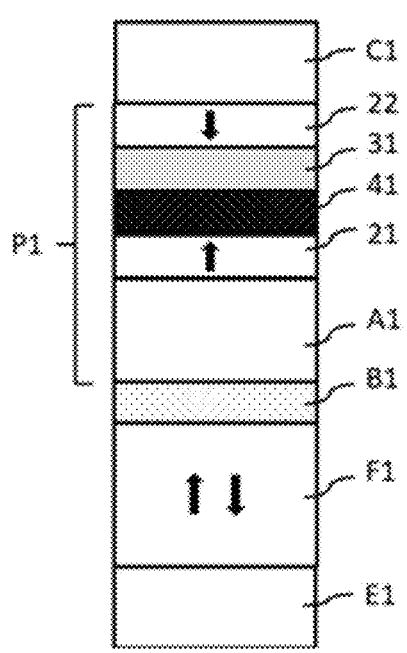
FIG. 39A and FIG. 39B show longitudinal cross-sectional views of an example of a magnetoresistance effect element of the present invention.
Figure 39B:
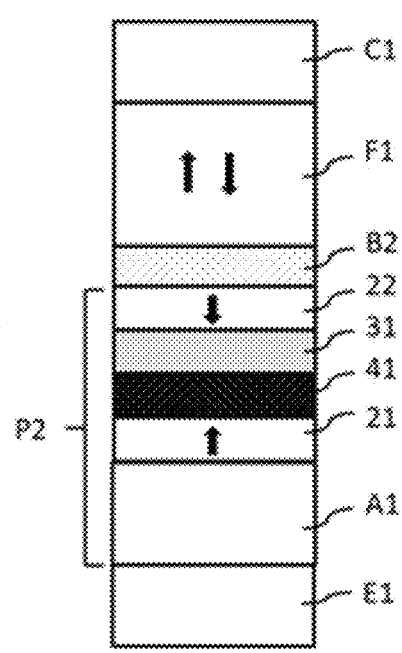
Figure 39C:
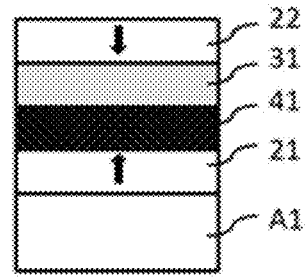
FIG. 39C shows an example of a magnetic film of the present invention.

From Embodiment 12, an example of the present invention is additionally summarized as shown in FIG. 39A to FIG. 39C.

FIG. 39A shows a part or all of the magnetoresistance effect element having a top-pinned structure, in which the order of the first non-magnetic layer (31) and the first Pt layer (41) laminated in FIG. 5 is reversed.

FIG. 39B shows a part or all of the magnetoresistance effect element having a bottom-pinned structure, in which the order of the first non-magnetic layer (31) and the first Pt layer (41) laminated in FIG. 15 is reversed.

In FIG. 39C, the adjustment layer is disposed on the magnetic layer, and the order of the first non-magnetic layer (31) and the first Pt layer (41) laminated in FIG. 25 is reversed.

Although not shown, similar to FIG. 39A and FIG. 5, FIG. 39B and FIG. 15, and FIG. 39C and FIG. 25, in FIG. 6, FIG. 7, FIG. 8, FIG. 9, FIG. 16, FIG. 17, FIG. 18, FIG. 19, FIG. 21, FIG. 26, FIG. 27, FIG. 28, FIG. 29, FIG. 30, FIG. 31, and FIG. 32 which have a configuration in which the non-magnetic layer and the Pt layer are laminated adjacent to each other, the order of the first non-magnetic layer (31) and the first Pt layer (41) laminated, and/or the order of the second non-magnetic layer (32) and the second Pt layer (42) laminated, and/or the order of the third non-magnetic layer (33) and the third Pt layer (43) laminated, and/or the order of the fourth non-magnetic layer (34) and the fourth Pt layer (44) laminated may be reversed. That is, if there are a plurality of non-magnetic layers and Pt layers laminated adjacent to each other, all of the non-magnetic layers and Pt layers laminated adjacent to each other may be laminated in reverse order or only some of them may be laminated in reverse order.

Here, in the above configuration, except that the lamination order of the non-magnetic layers and Pt layer laminated adjacent to each other was reversed, a configuration, film thicknesses, materials, and the like are the same as those when the lamination order is not revered.

In addition, although not shown, the following examples can also be used as modifications.

In Embodiment 1 shown in FIG. 5, a Pt insertion layer may be inserted between the first magnetic layer (21) and the first non-magnetic layer (31).

Similarly, in FIG. 6, FIG. 7, FIG. 8, FIG. 9, FIG. 15, FIG. 16, FIG. 17, FIG. 18, FIG. 19, FIG. 21, FIG. 25, FIG. 26, FIG. 27, FIG. 28, FIG. 29, FIG. 30, FIG. 31, FIG. 32, and the like which have a configuration in which the magnetic layer (adjustment layer side)/non-magnetic layer/Pt layer/magnetic layer in that order are laminated adjacent to each other, a Pt insertion layer may be inserted between the magnetic layer and the non-magnetic layer. Here, if there are a plurality of constitutions in which the magnetic layers (adjustment layer side)/non-magnetic layers/Pt layers/magnetic layers in that order are laminated adjacent to each other, a Pt insertion layer may be inserted between all the magnetic layers and the non-magnetic layers of the configuration in which the magnetic layer (adjustment layer side)/non-magnetic layer/Pt layer/magnetic layer in that order are laminated adjacent to each other, or a Pt insertion layer may be inserted between only some of the magnetic layers and the non-magnetic layers. The Pt insertion layer has a thickness preferably in a range of 0.1 nm to 0.9 nm and more preferably in a range of 0.25 nm to 0.7 nm.

Here, in the above configuration, except that the Pt insertion layer is inserted between the magnetic layer and the non-magnetic layer, a configuration, film thicknesses, materials, and the like are the same as those when the Pt insertion layer is not inserted.

In addition, in FIG. 39A, FIG. 39B, FIG. 39C, and the like which have a configuration in which the magnetic layer (adjustment layer side)/Pt layer/non-magnetic layer/magnetic layer in that order are laminated adjacent to each other, a Pt insertion layer may be inserted between the non-magnetic layer and the magnetic layer. Here, if there are a plurality of constitutions in which the magnetic layers (adjustment layer side)/Pt layers/non-magnetic layers/magnetic layers in that order are laminated adjacent to each other, a Pt insertion layer may be inserted between all the non-magnetic layers and the magnetic layers of the configuration in which the magnetic layer (adjustment layer side)/Pt layer/non-magnetic layer/magnetic layer in that order are laminated adjacent to each other, or a Pt insertion layer may be inserted between only some of the non-magnetic layers and the magnetic layers.

Here, in the above configuration, except that the Pt insertion layer is inserted between the non-magnetic layer and the magnetic layer, a configuration, film thicknesses, materials, and the like are the same as those when the Pt insertion layer is not inserted.

REFERENCE SIGNS LIST

21 First magnetic layer
22 Second magnetic layer
23 Third magnetic layer
24 Fourth magnetic layer
25 Fifth magnetic layer
26 Sixth magnetic layer
31 First non-magnetic layer
32 Second non-magnetic layer
33 Third non-magnetic layer
34 Fourth non-magnetic layer
35 Fifth non-magnetic layer
41 First Pt layer
42 Second Pt layer
43 Third Pt layer
44 Fourth Pt layer
45 Fifth Pt layer
A1 First adjustment layer
A2 Second adjustment layer
B1 First barrier layer
B2 Second barrier layer
P1 First fixing layer
P2 Second fixing layer
R1 First reference layer
F1 Recording layer
E1 Lower electrode
C1 Cap layer
H1 Heavy metal layer
BL1 First bit line
BL2 Second bit line
GND Ground line
WL Word line

What is claimed is:

1. A magnetic film comprising:
a first magnetic layer;
a first non-magnetic layer which is provided adjacent to the first magnetic layer;
a first Pt layer which is provided adjacent to the first non-magnetic layer on a side opposite to the first magnetic layer; and
a second magnetic layer which is provided adjacent to the first Pt layer on the side opposite to the first non-magnetic layer, wherein
magnetization directions of the first magnetic layer and the second magnetic layer are both a direction perpendicular to a film surface,
an antiferromagnetic coupling is formed between the first magnetic layer and the second magnetic layer, and
a film thickness of the first Pt layer is in range of 0.25 nm to 0.9 nm.,
wherein the antiferromagnetic coupling between each of the first magnetic layer and second magnetic layer is maintained after an annealing treatment of between 300° C. to 400° C., and
a first adjustment layer disposed on and in contact with a side of the first magnetic layer opposite the first non-magnetic layer, and
the first adjustment layer contains Pt.

2. The magnetic film according to claim 1, wherein the first magnetic layer and the second magnetic layer are Co.

3. The magnetic film according to claim 1, wherein the first non-magnetic layer is Ir or Ru.

4. The magnetic film according to claim 3, wherein the Ir film thickness of the first non-magnetic layer is 0.5±0.15 nm or 1.35±0.1 nm, or the Ru film thickness is 0.9±0.2 nm or 0.4±0.15 nm.

5. The magnetic film according to claim 1, wherein the film thickness of the second magnetic layer is thicker than the film thickness of the first Pt layer.

6. The magnetic film according to claim 1, further comprising a second non-magnetic layer which is provided adjacent to the second magnetic layer on the side opposite to the first Pt layer;
- a second Pt layer which is provided adjacent to the second non-magnetic layer on the side opposite to the second magnetic layer, and
- a third magnetic layer which is provided adjacent to the second Pt layer on the side opposite to the second non-magnetic layer, wherein
- the magnetization direction of the third magnetic layer is a direction perpendicular to the film surface, and
- an antiferromagnetic coupling is formed between the second magnetic layer and the third magnetic layer.

7. The magnetic film according to claim 6, further comprising
- a third non-magnetic layer which is provided adjacent to the third magnetic layer on the side opposite to the second Pt layer,
- a third Pt layer which is provided adjacent to the third non-magnetic layer on the side opposite to the third magnetic layer, and
- a fourth magnetic layer which is provided adjacent to the third Pt layer on the side opposite to the third non-magnetic layer, wherein
- the magnetization direction of the fourth magnetic layer is a direction perpendicular to the film surface, and
- an antiferromagnetic coupling is formed between the third magnetic layer and the fourth magnetic layer.

8. The magnetic film according to claim 7, further comprising
- a fourth non-magnetic layer which is provided adjacent to the fourth magnetic layer on the side opposite to the third Pt layer,
- a fourth Pt layer which is provided adjacent to the fourth non-magnetic layer on the side opposite to the fourth magnetic layer, and
- a fifth magnetic layer which is provided adjacent to the fourth Pt layer on the side opposite to the fourth non-magnetic layer, wherein
- the magnetization direction of the fifth magnetic layer is a direction perpendicular to the film surface, and
- an antiferromagnetic coupling is formed between the fourth magnetic layer and the fifth magnetic layer.

9. A magnetoresistance effect element comprising:
- a first fixing layer including the magnetic film according to claim 1; and
- a first barrier layer, wherein
- the first barrier layer is disposed on the side of the first adjustment layer of the first fixing layer, and
- the first adjustment layer is a Co/Pt multilayer film.

10. The magnetoresistance effect element according to claim 9, wherein
- the first magnetic layer and the second magnetic layer are Co,
- the first non-magnetic layer is Ir or Ru, and
- the Ir film thickness of the first non-magnetic layer is 0.5±0.15 nm or 1.35±0.1 nm, and
- the Ru film thickness is 0.9±0.2 nm or 0.4±0.15 nm.

11. A magnetoresistance effect element comprising:
- a second fixing layer including the magnetic film according to claim 1; and
- a second barrier layer, wherein
- the second barrier layer is disposed on the side opposite to the first adjustment layer of the second fixing layer, and
- the first adjustment layer is a layer containing Pt as a main element.

12. A magnetic memory comprising the magnetoresistance effect element according to claim 9.

13. The magnetic film according to claim 1, wherein the second magnetic layer has an fcc (111) crystal structure.

* * * * *